United States Patent
Tan et al.

(10) Patent No.: US 10,105,883 B2
(45) Date of Patent: Oct. 23, 2018

(54) IMPRINT LITHOGRAPHY SYSTEM AND METHOD FOR MANUFACTURING

(71) Applicant: Nanonex Corporation, Monmouth Junction, NJ (US)

(72) Inventors: Hua Tan, Princeton Junction, NJ (US); Lin Hu, Livingston, NJ (US); Wei Zhang, Newton, PA (US); Stephen Y. Chou, Princeton, NJ (US)

(73) Assignee: NANONEX CORPORATION, Monmouth Junction, NJ (US)

( * ) Notice: Subject to any disclaimer, the term of this patent is extended or adjusted under 35 U.S.C. 154(b) by 0 days.

(21) Appl. No.: 14/776,568

(22) PCT Filed: Mar. 16, 2014

(86) PCT No.: PCT/US2014/030106
§ 371 (c)(1),
(2) Date: Sep. 14, 2015

(87) PCT Pub. No.: WO2014/145360
PCT Pub. Date: Sep. 18, 2014

(65) Prior Publication Data
US 2016/0039126 A1    Feb. 11, 2016

Related U.S. Application Data

(60) Provisional application No. 61/793,012, filed on Mar. 15, 2013.

(51) Int. Cl.
*B29C 59/02*    (2006.01)
*B29C 43/58*    (2006.01)
(Continued)

(52) U.S. Cl.
CPC ............ *B29C 43/58* (2013.01); *B29C 39/026* (2013.01); *B29C 43/021* (2013.01);
(Continued)

(58) Field of Classification Search
CPC .................. B29C 59/02; B29C 59/022; B29C 2043/5833; G03F 7/0002
(Continued)

(56) References Cited

U.S. PATENT DOCUMENTS

| | | |
|---|---|---|
| 1,048,281 A | 12/1912 | Bing |
| 2,124,711 A | 7/1938 | Rowell |

(Continued)

FOREIGN PATENT DOCUMENTS

| | | |
|---|---|---|
| JP | 2003077867 | 3/2003 |
| WO | 2001042858 A1 | 6/2001 |

(Continued)

OTHER PUBLICATIONS

Keil et al, Journal Vaccum Science & Technology, B 22(6) Nov./Dec. 2004, "Process Development and Characterization of Antisticking Layers on Nickel-based Stamps Designed for Nanoimprint Lithography."

(Continued)

*Primary Examiner* — Matthew J Daniels
*Assistant Examiner* — Lawrence D. Hohenbrink, Jr.
(74) *Attorney, Agent, or Firm* — Siu Lo; Julian Gonzalez; Venkatesh Hariharan

(57) ABSTRACT

A nanoimprint lithography system and method for manufacturing substrates with nano-scale patterns, having a process chamber with transparent sections on both top and side walls, a robot for automatic molds and substrates loading and unloading, and optical and stage apparatuses to obtain the desired spatial relationship between the mold and substrate, with an enclosed volume referring to mold mini-chamber being formed between the mold/holder and top wall of the chamber and with the process chamber and mini-chamber being capable of both vacuuming and pressurizing, and inside the chamber, a ring shape seal assembly (Continued)

is installed and a mold support assembly can be installed that aids in imprinting all the way to the edge of the substrate with various embodiments for carrying out fluid pressure imprinting, separation, measurement and control of mold and substrate gap, substrate thickness, and system axial force.

26 Claims, 28 Drawing Sheets

(51) Int. Cl.
  *G03F 7/00* (2006.01)
  *B29C 39/02* (2006.01)
  *B29C 43/02* (2006.01)
  *B29L 9/00* (2006.01)
(52) U.S. Cl.
  CPC .......... *B29C 59/022* (2013.01); *G03F 7/0002* (2013.01); *B29C 59/02* (2013.01); *B29C 2043/5833* (2013.01); *B29L 2009/00* (2013.01)
(58) Field of Classification Search
  USPC .................. 264/571, 293, 40.5; 425/385
  See application file for complete search history.

(56) References Cited

U.S. PATENT DOCUMENTS

| | | | |
|---|---|---|---|
| 2,285,080 A | 6/1942 | Berge | |
| 3,485,908 A | 12/1969 | Burger | |
| 3,678,889 A | 7/1972 | Murakami et al. | |
| 3,830,194 A | 8/1974 | Benzing et al. | |
| 3,830,681 A | 8/1974 | Wilson | |
| 4,112,030 A | 9/1978 | Kremzow | |
| 4,506,815 A | 3/1985 | Melas et al. | |
| 4,524,716 A | 6/1985 | Mueller | |
| 4,593,740 A | 6/1986 | Buhler | |
| 5,772,905 A | 6/1998 | Chou | |
| 5,804,017 A | 9/1998 | Hector | |
| 5,947,027 A | 9/1999 | Burgin et al. | |
| 6,235,118 B1 | 5/2001 | Hayashi | |
| 6,286,452 B1 | 9/2001 | Namiki et al. | |
| 6,309,580 B1 | 10/2001 | Chou | |
| 6,482,742 B1 * | 11/2002 | Chou ................ | B29C 43/003 264/293 |
| 6,518,189 B1 | 2/2003 | Chou | |
| 6,578,891 B1 | 6/2003 | Suzuki et al. | |
| 6,696,099 B2 | 2/2004 | Ro | |
| 6,696,220 B2 | 2/2004 | Bailey et al. | |
| 6,805,054 B1 | 10/2004 | Meissl et al. | |
| 6,828,244 B2 | 12/2004 | Chou | |
| 6,900,881 B2 | 5/2005 | Sreenivasan et al. | |
| 6,908,861 B2 | 6/2005 | Screenivasan et al. | |
| 7,137,803 B2 | 11/2006 | Chou | |
| 7,294,294 B1 | 11/2007 | Wago et al. | |
| 7,322,287 B2 | 1/2008 | Tan et al. | |
| 7,537,658 B2 | 5/2009 | Nasu et al. | |
| 8,329,089 B2 | 12/2012 | Kim et al. | |
| 8,377,361 B2 | 2/2013 | Zhang et al. | |
| 8,632,720 B2 | 1/2014 | Zhang et al. | |
| 8,747,092 B2 | 6/2014 | Zhang et al. | |
| 2002/0115002 A1 | 8/2002 | Bailey et al. | |
| 2002/0134512 A1 | 9/2002 | Adachi et al. | |
| 2003/0064604 A1 | 4/2003 | Umeda | |
| 2003/0159608 A1 | 8/2003 | Heidari | |
| 2003/0196763 A1 | 10/2003 | Miyamoto et al. | |
| 2004/0008334 A1 | 1/2004 | Sreenivasan et al. | |
| 2004/0202865 A1 | 10/2004 | Homola et al. | |
| 2004/0251775 A1 | 12/2004 | Choi et al. | |
| 2005/0042553 A1 | 2/2005 | Lu et al. | |
| 2005/0056216 A1 | 3/2005 | Kuse | |
| 2005/0116370 A1 | 6/2005 | Ogino et al. | |
| 2005/0145119 A1 | 7/2005 | Tan et al. | |
| 2005/0146078 A1 | 7/2005 | Chou et al. | |
| 2005/0167894 A1 * | 8/2005 | Shih ................ | B29C 33/62 264/496 |
| 2005/0170269 A1 | 8/2005 | Nakagawa et al. | |
| 2005/0271900 A1 | 12/2005 | Kobrin et al. | |
| 2005/0275125 A1 | 12/2005 | Kawakami et al. | |
| 2006/0037997 A1 | 2/2006 | Higashi et al. | |
| 2006/0131785 A1 | 6/2006 | Sewell | |
| 2006/0157444 A1 | 7/2006 | Nakamura et al. | |
| 2006/0172549 A1 | 8/2006 | Choi et al. | |
| 2006/0172553 A1 | 8/2006 | Choi et al. | |
| 2006/0219754 A1 | 10/2006 | Clauberg et al. | |
| 2006/0222899 A1 | 10/2006 | Sugimura et al. | |
| 2006/0262393 A1 | 11/2006 | Toyoda | |
| 2006/0273488 A1 | 12/2006 | Seki et al. | |
| 2006/0292463 A1 | 12/2006 | Best et al. | |
| 2007/0035717 A1 * | 2/2007 | Wu ................ | B82Y 10/00 355/78 |
| 2007/0059497 A1 | 3/2007 | Huang et al. | |
| 2007/0114686 A1 | 5/2007 | Choi et al. | |
| 2007/0166557 A1 | 7/2007 | Keil et al. | |
| 2007/0190200 A1 | 8/2007 | Cherala et al. | |
| 2007/0228589 A1 | 10/2007 | Choi et al. | |
| 2008/0029931 A1 * | 2/2008 | Tada ................ | B29C 37/0003 264/293 |
| 2008/0122144 A1 | 5/2008 | Zhang et al. | |
| 2008/0131623 A1 | 6/2008 | Zhang et al. | |
| 2008/0188070 A1 * | 8/2008 | Johnson ............. | H01L 24/11 438/613 |
| 2008/0203271 A1 * | 8/2008 | Okinaka ............ | B29C 33/3857 249/114.1 |
| 2008/0204684 A1 | 8/2008 | Cho et al. | |
| 2008/0213418 A1 * | 9/2008 | Tan ................ | B82Y 10/00 425/112 |
| 2009/0140445 A1 * | 6/2009 | Lu ................ | B29C 43/003 264/40.1 |
| 2010/0173032 A1 | 7/2010 | Suehira et al. | |
| 2010/0201042 A1 | 8/2010 | Sreenivasan et al. | |
| 2010/0244324 A1 | 9/2010 | Zhang et al. | |
| 2011/0180965 A1 * | 7/2011 | Zhang ................ | B82Y 10/00 264/293 |
| 2012/0019921 A1 * | 1/2012 | Yamada ............. | A01K 63/003 359/601 |
| 2012/0299222 A1 | 11/2012 | Lan et al. | |
| 2014/0239529 A1 | 8/2014 | Tan et al. | |

FOREIGN PATENT DOCUMENTS

| | | |
|---|---|---|
| WO | 2003090985 A1 | 11/2003 |
| WO | 2004021083 A1 | 3/2004 |

OTHER PUBLICATIONS

Po-Ching Kao et al, IEEE Transactions on Electronic Devices—V52 N8—Aug. 2005, "Fabrication of Large-Scaled Organic Light Emitting Devices on the Flexible Substrates Using Low-Pressure Imprinting Lithography."
Henri Jansen et al, J. Micromech, Microeng, 6 (1996) 14-28, "A Survey on the Reactive Ion Etching of Silicon in Microtechnology."
PCT Search Report, PCT US 2014/030106, dated Aug. 1, 2014.
PCT Search Report, PCT US 2014/030655, dated Sep. 10, 2014.

* cited by examiner

IMPRINT LITHOGRAPHY SYSTEM AND METHOD FOR MANUFACTURING

CROSS-REFERENCE TO RELATED APPLICATIONS

This application is a National Stage of International Application No. PCT/US14/30106, filed on Mar. 16, 2014, which claims the benefit of U.S. Provisional Application No. 61/793,012, filed on Mar. 15, 2013, the disclosures of which are incorporated herein by reference.

FIELD

This invention relates to system and methods for imprint lithography. It is particularly useful for fast mass production of substrates with replication of patterns from a mold having microscale or nanoscale features by imprint lithography.

BACKGROUND

Nanoimprint lithography, also often called imprint lithography, is capable of replicating patterns on a pre-made mold as small as several nanometers. The pre-made mold has extruded areas and recessed areas on its replication surface, which constitute patterns of various shapes and sizes. The mold was typically made by a patterning step using electron beam lithography (EBL) or mixing of EBL and optical lithography, and, a follow-up etching step using reactive ion etching (RIE) to create the patterns. Nanoimprint lithography starts from applying a volume of polymer onto a substrate by either spinning or dispensing. The polymer is either flowable in ambient temperature, or, from rigid to deformable or flowable by thermally heating. Then, the pre-made mold is positioned to contact with the substrate. After that, the mold is pressed against the substrate. If the polymer is in liquid in ambient temperature, pressing the mold against the substrate will force the surface extrusion areas on the mold replication surface to go into the layer of the polymer. If the polymer is rigid in ambient temperature, a thermally heating step is conducted prior to the contact, after the contact but before the pressing, or during the pressing to make the polymer deformable or flowable. Thus, pressing the mold against the mold is able to force the surface extrusion areas on the mold replication surface to go into the layer of the polymer. When the extruded areas completely go into the layer of the polymer, the polymer is transited from deformable or flowable into rigid by UV radiation, thermally heating or thermally cooling depending on types of the polymer. At last, the mold is released from the substrate while the layer of the polymer attaches to the substrate. To prevent the polymer from sticking to the mold, a very thin release coating can be deposited on the replication surface of the mold. Typical release coating included surface release surfactant and per-fluoro polymer deposited by CVD. After the substrate is separated from the mold, the extrusion areas on the mold surface are corresponding to the recessed areas in the polymer layer. Therefore, a reverse-tone replication of the patterns on the mold is formed onto the polymer film on the substrate. The polymer can be a thermo-plastic polymer or curable polymer. A thermo-plastic polymer transits from rigid to deformable or flowable when being heated above its glass transition temperature, and, vice versa when is cooled below its glass transition temperature. A curable polymer is deformable or flowable originally, and transit to rigid when being heating to curing temperature for thermo-set type or being cured under UV exposure for UV-curable type. When alignment is needed, the mold is aligned with the substrate through a set of matching align markers prior to the contact. Previously, electron beam lithography is very slow to write nanoscale patterns. It is unlikely to use it for mass production of nanoscale devices. Nanoimprint lithography is able to replicate whole area of patterned surface of the pre-made mold onto the substrate by one cycle of the process. It can dramatically increase the efficiency of patterning nanoscale features. Because the mold is repeatedly used for many cycles of imprinting, the high cost of using electron beam lithography to make the mold is averaged into these many imprints. Nanoimprint lithography delivers a practical method to produce nanoscale devices at low cost.

Since its invention in 1995 by Stephen Y. Chou (referring to U.S. Pat. No. 5,772,905), nanoimprint lithography has successfully demonstrated its capability of replicating a feature as small as 5 nm. Meanwhile, many research works were carried out on developing resists for imprinting, mold making techniques, mold release coating for clean separation, and apparatus to do imprinting. In overall, nanoimprint lithography has evolved into being a widely used technology for research laboratories, but not reached a stage ready to meet much higher requirements of industrial use. One of the critical improvements needed by industrial use is imprint system and method with high throughput and overlay accuracy.

Fast nanoimprint apparatus is highly demanded by semiconductor, opto-electronics, and magnetic media industries to use this technology to manufacture nano-scale device products. Prior to the invention, the apparatus of nanoimprint lithography conducted aligning and contacting the mold with the substrate and pressing the mold against the substrate on two different sites within frame of the apparatus. Separating the mold from the substrate was often conducted on either one site of them or a third site. This basic design approach demanded to transfer the contacted mold/substrate set among these sites to finish a full cycle of operation. Thus, throughput of the apparatus, which is defined as time consumption to finish a cycle of imprinting, is severely degraded by time cost of transferring among these different sites. Furthermore, the internal transferring increases mechanical complexity of the apparatus and potentially introduces mechanical failure during operation. An apparatus capable of completing a full cycle of imprinting process on one site within its frame limit will potentially achieve much higher throughput and reliability.

SUMMARY

The disclosed system and methods to mass produce molds or substrates with micro-scale and nano-scale patterns using nanoimprint lithography. Generally, the system has a chamber with transparent sections on its top wall and side wall. A hollow mold holder is fixed to the top inner surface of the chamber and positioned underneath the transparent top section. By changing the type of mold holders used in the system, molds of different materials or different sizes and thicknesses can be fixed to the mold holder and carry out imprint. More specifically, transparent, semi-transparent or opaque molds (all referring to visible wavelength) can be used in the system for nanoimprint. An enclosed volume referring to mold mini-chamber is formed between the mold/holder and top wall of the chamber. Inside chamber, a stage assembly, leveling apparatus, and force sensing apparatus are installed. A chuck to vacuum hold a substrate is mounted on top of the stage assembly. At beginning of the imprinting, the substrate with a layer of resist is positioned underneath the mold at a predetermined gap between them. Then, the substrate is moved up to contact with the mold either under vacuum, under atmosphere or under pressure from a mixture of different gases. The substrate and mold can be pressed further by introducing higher pressure inside the chamber. To seal the edge for gas pressure, one way is by seal the edge of the substrate against the mold using a special ring shaped material. The other way is relying on the resist merging to squeeze out or absorb the extra air. After consolidating the resist, the substrate is separated from the mold by motions enabled by stage movements, or deforming the mold enabled by differential pressure between the mold mini-chamber and the bulk volume of the chamber, or a mixing of both.

On the side wall of the chamber, there is also a gate which allows the mold and substrates of various sizes to be passed through. Upon activation, the gas driven gate will move up first and then move horizontally to seal against the wall. Additional air driven cylinders will be used to further push against the door to make sure the chamber can take high pressure as well as high vacuum.

A multi-axis robot is used to transfer the imprint molds and substrates to the chamber. Different end effectors can be mounted on the same robot to handle molds and substrates of different form factors. Positions and orientations of molds and substrates can be adjusted at different stations in the system. Before imprint, the molds are adjusted with the patterned side facing down, while the substrates are adjusted with the patterned side facing up. After imprint, the molds are adjusted with the patterned side facing up before placing back into the mold cassette.

BRIEF DESCRIPTION OF THE DRAWINGS

The features, nature and advantages of the disclosure will be more clearly understood by consideration of the illustrative embodiments now to be described in detail in connection with the accompanying drawing. In the drawing.

It is to be understood that these drawings are for purposes of illustrating the concept of the disclosure and are not to scale. It should be understood that throughout the drawings, corresponding reference numerals indicate like or corresponding parts and features.

DETAILED DESCRIPTION

The descriptions assume that UV curable imprint is conducted if it is not clearly identified and UV curable imprint is used as example. However, the disclosure does not limit for UV curable imprint and also apply for thermo-plastic imprint. An ordinary skilled in the art who is familiar with nanoimprint technology can easily revise the embodiment described in the disclosure to implement the concept of the disclosure for all type of imprinting.

First a mold holder 200 will be mechanically fixed tightly onto the top inside wall of the chamber. There can be seals between the mold holder and chamber wall against fluid leakage. Alternatively, the mold holder 200 can be slide into the chamber through a loading guide rail until it is against a hard stop. Then force adjustable mechanical clamps will push mold holder sideways against a hard stop and at the same time push mold holder upwards against the top inside wall of the chamber. There can be seals between the mold holder and chamber wall against fluid leakage.

Figure 4:
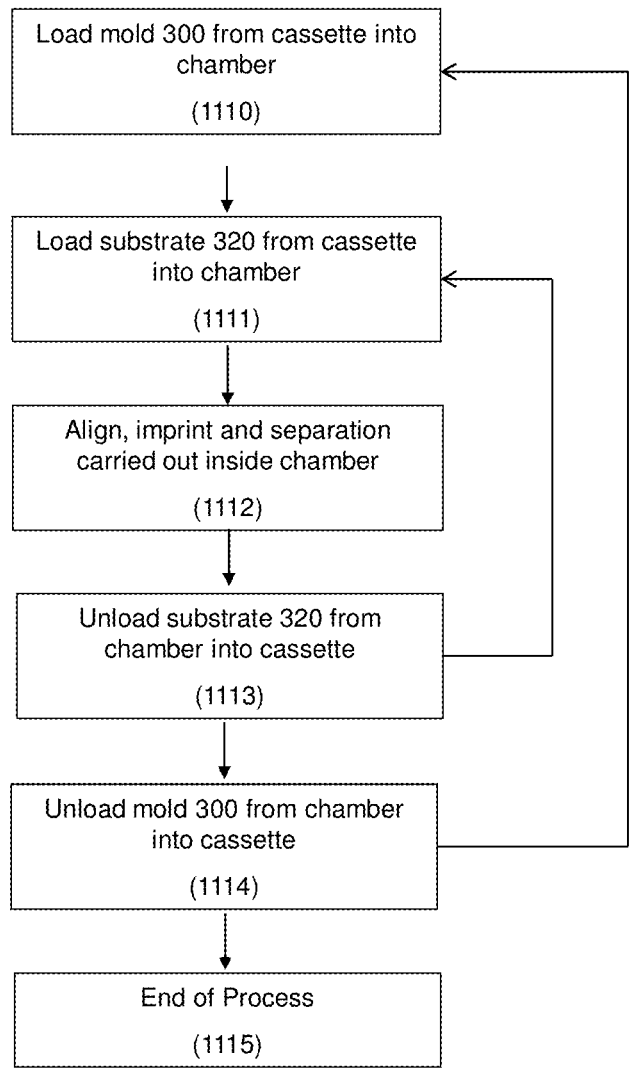
FIG. 4 is a flow chart to show the system operation process.

The overall process of the system is illustrated in FIG. 4. The system includes, among other things, a chamber, a door, Z axis motion stage, force sensing apparatus, mold and substrate holders, optional alignment stages, optional dispensing station, UV sources, optional fine leveling stages, gap sensors. Referring to step 1110 and 1111, mold 300 will be loaded into the chamber first, then substrate 320 will be loaded from cassette into the chamber. The alignment, imprint and separation will be carried out inside the chamber (step 1112). Then the substrate will be unloaded from the chamber back into the cassette (step 1113). Now that one imprint is finished, the system will allow user to select whether to load a new substrate, load a new mold, or finish up the process. If the process is finished, the system will start to unload the mold (step 1114). If users would like to load a new mold, the system will unload current mold (step 1114), then go back to step 1110. If users would like to load a new substrate, then the system goes back to step 1111.

Figure 18:
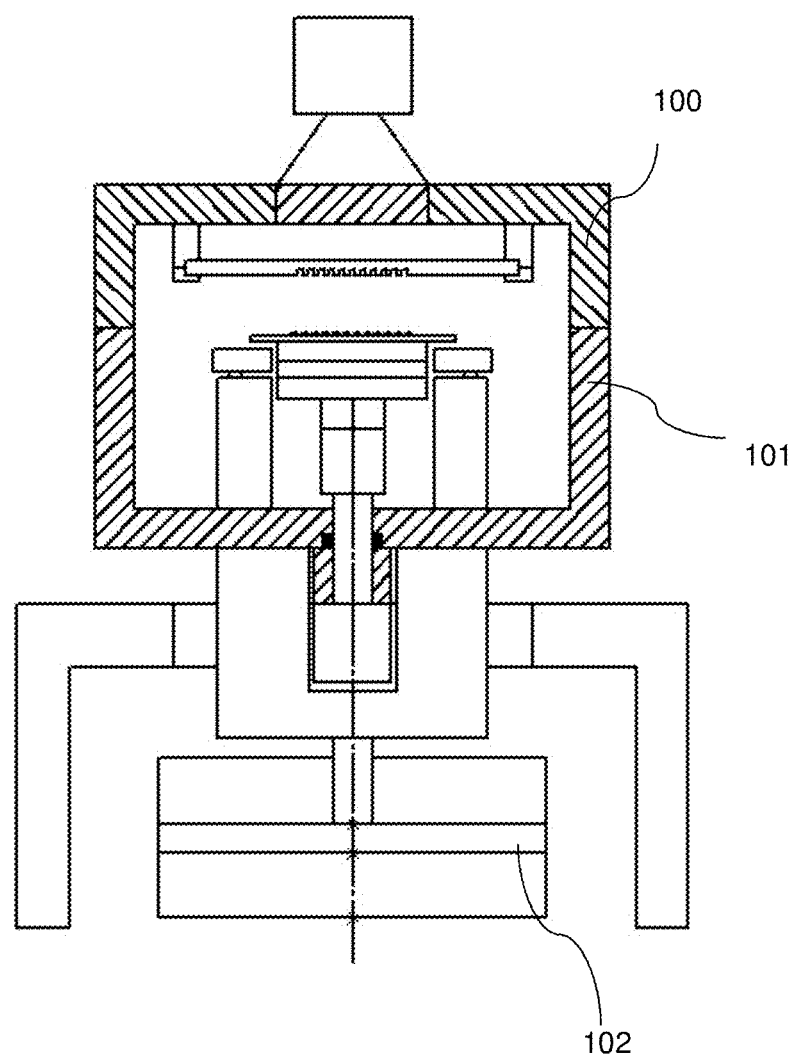
FIG. 18 is a schematic drawing illustrating the process chamber.

Alternatively, the chamber can also consist two parts as shown in FIG. 18. Mold and mini-chamber are mounted with top chamber 100, while substrate and substrate holder are mounted with bottom main chamber 101. There is an air cylinder 102 to move chamber 101 up or down, to close or open the chamber. When loading or unloading substrates or molds, the chamber needs to be opened. The cylinder can also be mounted on top to move chamber top section 100 up or down, to open or close the chamber for loading and unloading purposes. Windows can also be included in the side walls of either 101 or 102 to allow UV lights to pass through.

Figure 23:
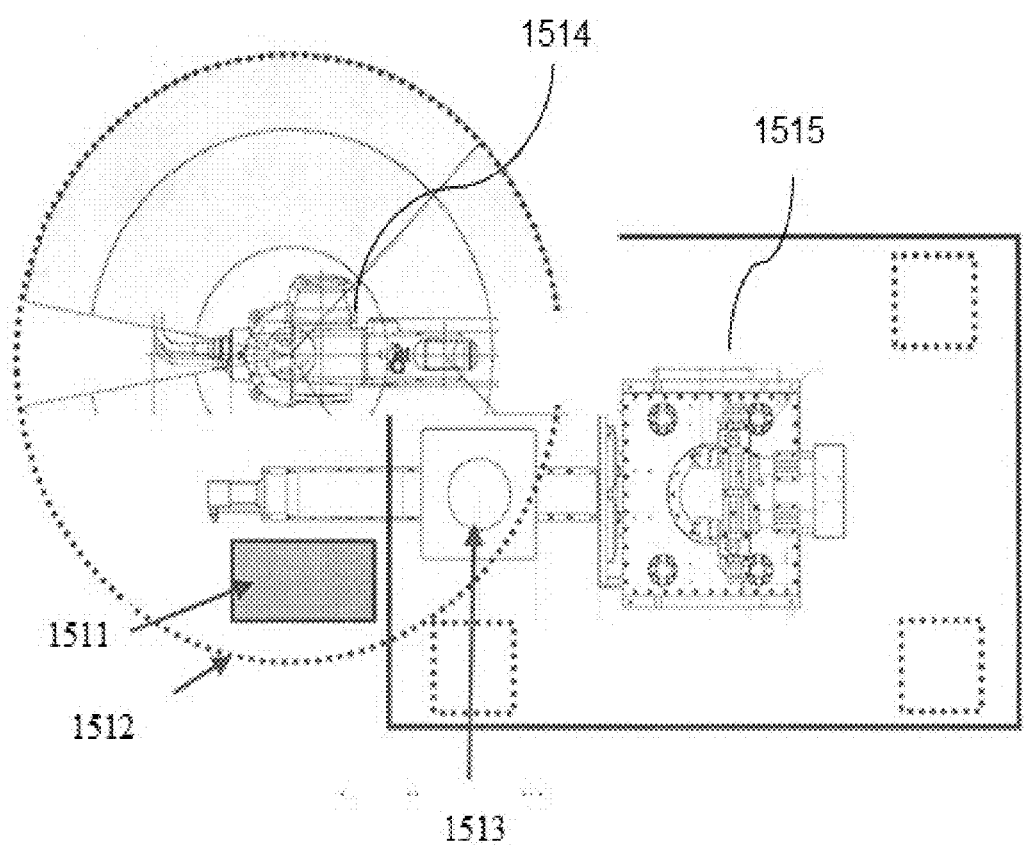
FIG. 23 is a schematic layout of system showing using magnetic disc as substrate.
Figure 24:
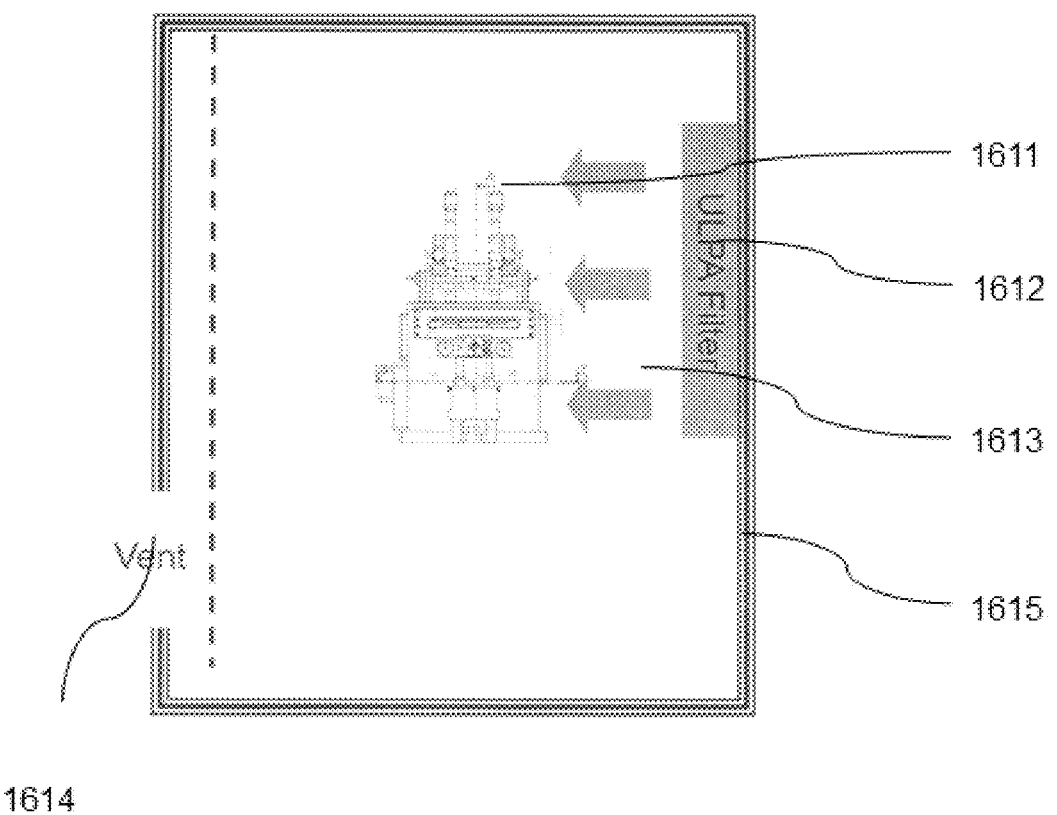
FIG. 24 is a layout of system showing air flow design to reduce dusts.
Figure 25:
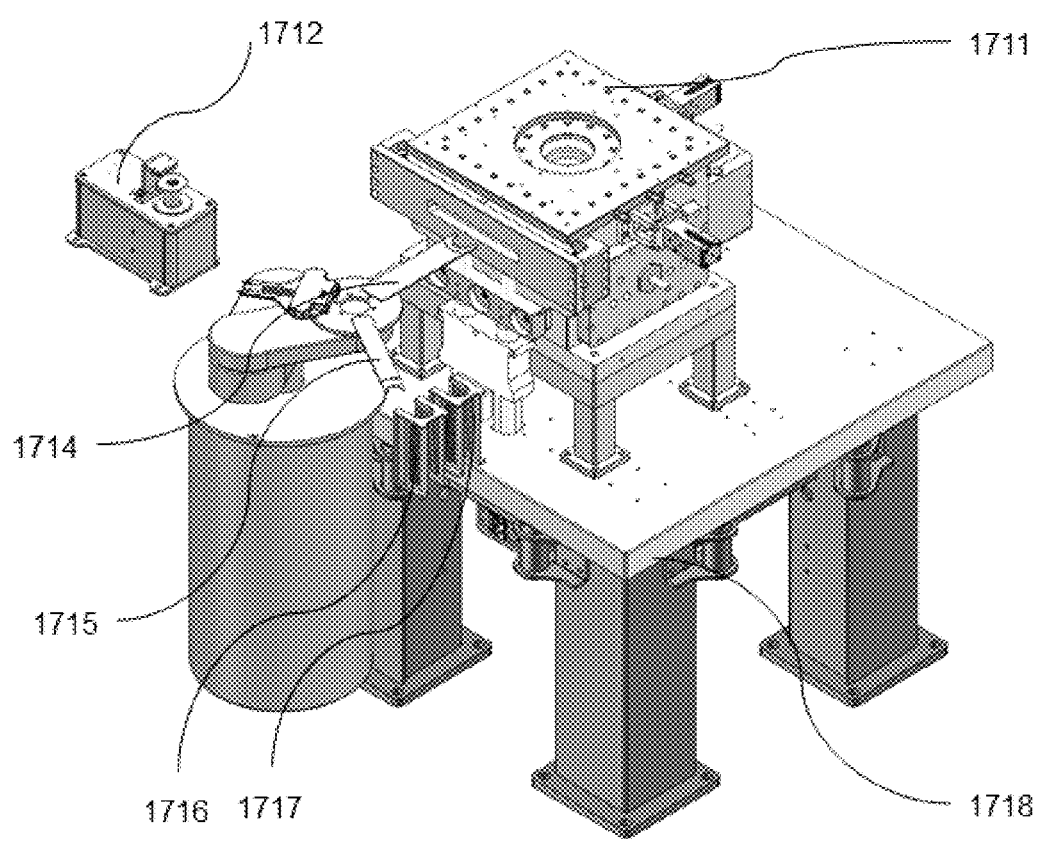
FIG. 25 is a layout of system showing loading robot sub-systems.

Sample loading and unloading process of the system is illustrated in serial drawings of FIG. 5-8. The system has a robot with end effectors and controlled by a computer with computer executable instructions. They are configured to place the substrate first to a pre-aligner, to correct the error due to sample placement, then to the substrate holder inside the chamber. FIG. 25 illustrated a robot with 2 end effectors, an input cassette and an output cassette, a pre-aligner, a vibration table and a chamber. The system is capable of correcting the substrate placement error in the X-Y-rotation well within 100 um. Depending on the type of the substrates and molds, different end effectors, different machine layout (as shown in FIG. 23) can also be used.

Figure 27A:
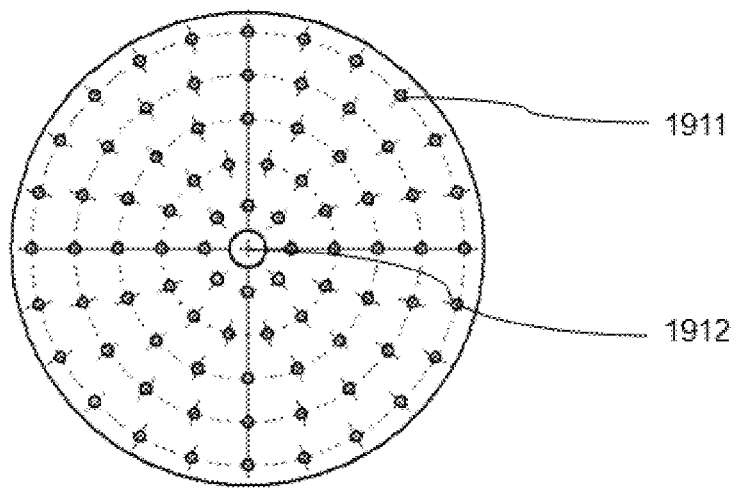
FIG. 27a-b illustrates top and side schematic views of the substrate chuck.
Figure 27B:
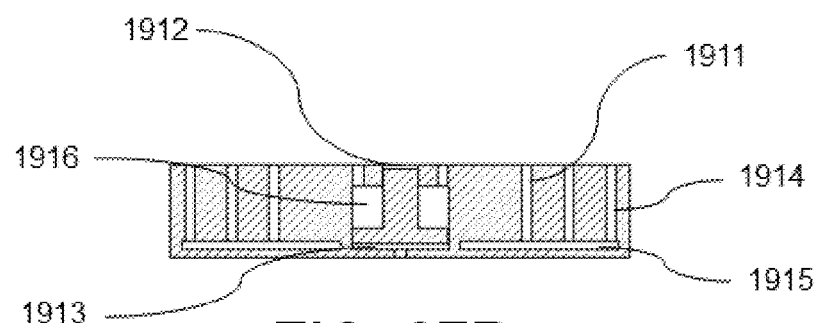

As shown in FIG. 27, to pick up samples from the end effector, the substrate chuck inside chamber has at least one movable pin. Meanwhile, multiple vacuum pinholes on the chuck can be used to uniformly hold the substrate. It can also be used to provide an upward fluid pressure on the backside of the substrate during the imprint to improve the imprint uniformity.

Figure 5:
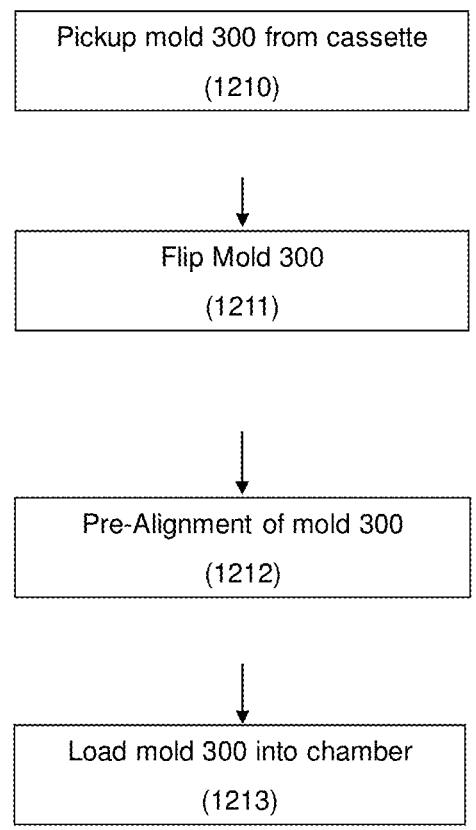
FIG. 5 is a flow chart to show steps of mold loading of the operation process.
Figure 9:
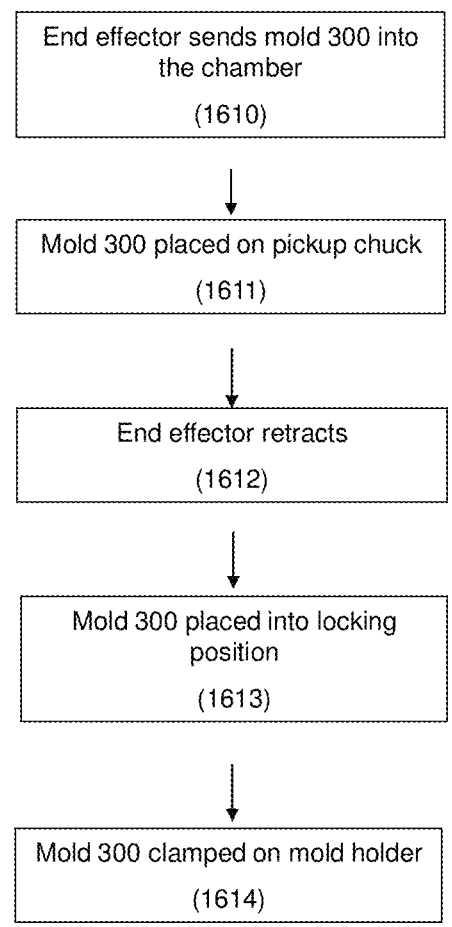
FIG. 9 is a flow chart to show detail steps of transferring molds from robot to the process chamber.

The step 1110 of loading mold 300 from cassette to chamber is further illustrated in FIG. 5. The robot will pick up mold 300 from the cassette (step 1210), then flip the mold so the pattern surface is facing down (step 1211). After that, the mold is placed inside a pre-aligner where its position in the X, Y, and Z plane is determined (step 1212). Finally, the robot will continue to load the mold 300 into the chamber (step 1213). Step 1213 of loading mold 300 into the chamber is further illustrated in FIG. 9. Alternatively, mold 300 can be manually fixed on a mold holder first, then be slide into the chamber via a loading guide rail. Steps shown in FIG. 9 will not then be needed.

Figure 6:
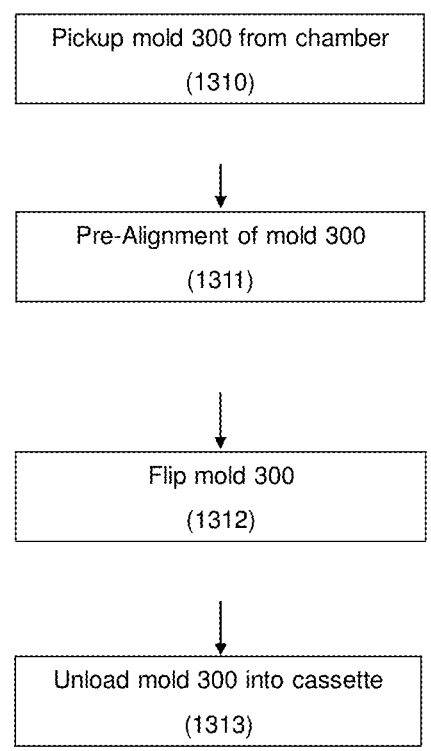
FIG. 6 is a flow chart to show steps of mold unloading of the operation process.
Figure 10:
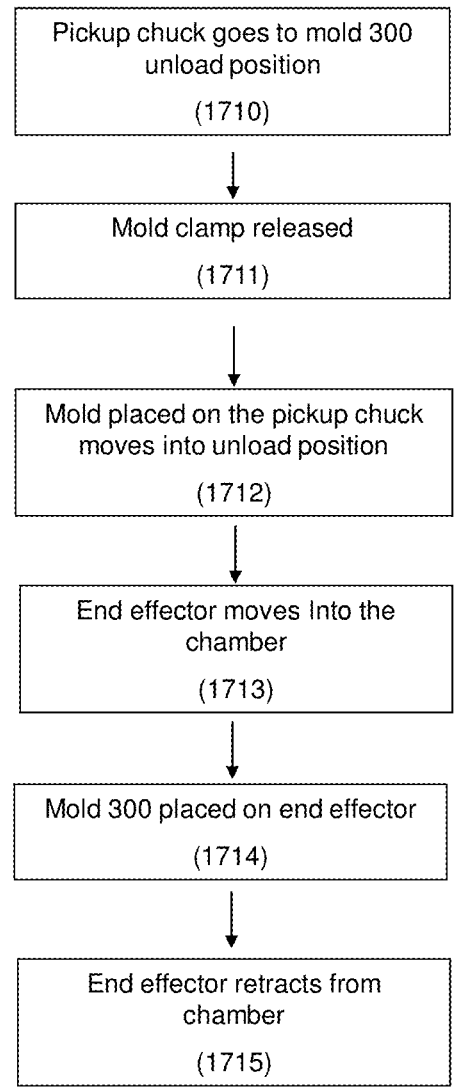
FIG. 10 is a flow chart to show detail steps of transferring molds from process chamber to robot.

The step 1114 of unloading mold 300 to a cassette is further illustrated in FIG. 6. The robot will pick up mold 300 from the chamber (step 1310), then align it so its position in the X, Y, and Z plane is determined (step 1311). After that, the mold is flipped so its patterned surface is facing up (step 1312). Finally, the robot will unload the mold 300 into the cassette (step 1313). Step 1310 of unloading mold from the chamber is further illustrated in FIG. 10. Alternatively the mold can be slide out of the chamber via a loading rail. Steps shown in FIG. 10 will not then be needed.

Figure 7:
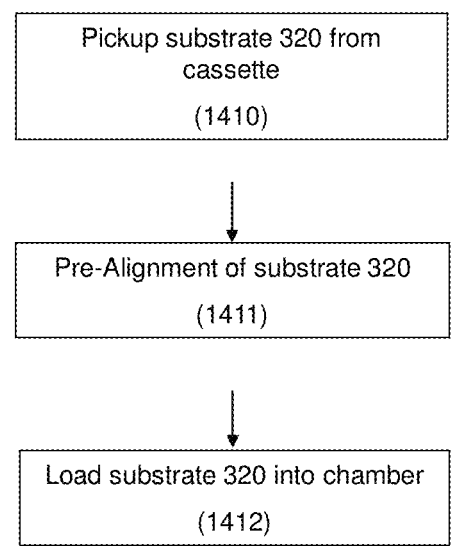
FIG. 7 is a flow chart to show steps of substrates loading of the operation process.
Figure 11:
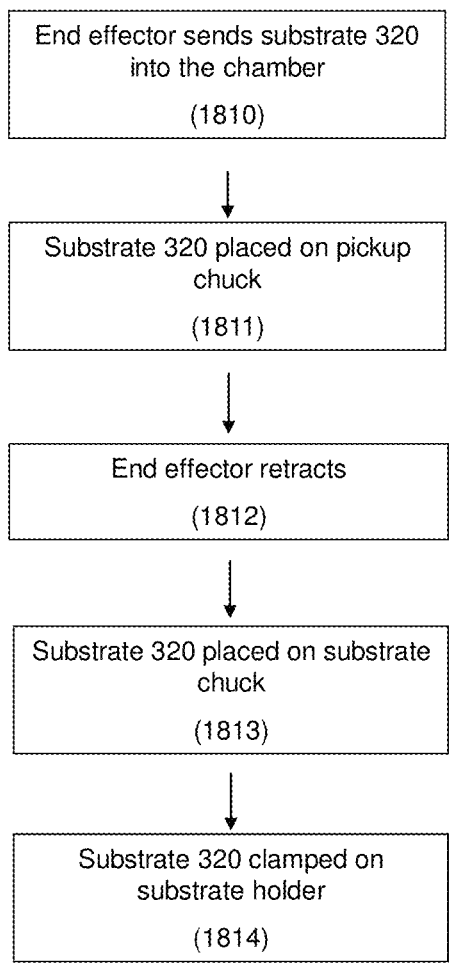
FIG. 11 is a flow chart to show detail steps of transferring substrate from robot to process chamber.

The step 1111 of loading substrate is further illustrated in FIG. 7. The robot will pick up substrate 320 from cassette (step 1410), then pre-align it so its position in the X, Y, and Z plane is determined (step 1411). Finally the substrate 320 is placed inside chamber (step 1412). Step 1412 of loading substrate into the chamber is further illustrated in FIG. 11.

Figure 8:
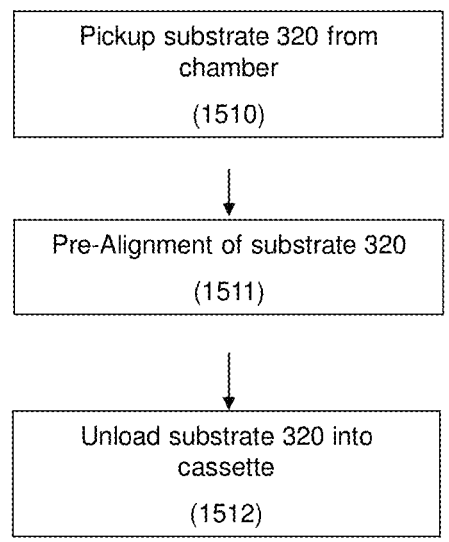
FIG. 8 is a flow chart to show steps of substrates unloading of the operation process.
Figure 12:
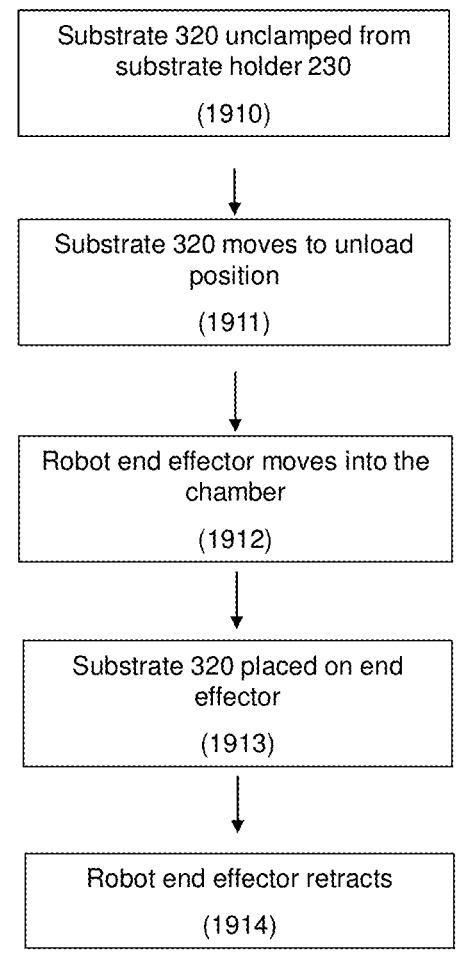
FIG. 12 is a flow chart to show detail steps of transferring substrate from process chamber to robot.

The step 1113 of unloading substrate is further illustrated in FIG. 8. The robot will pick substrate 320 from the chamber (step 1510), then align it so its position in the X, Y, and Z plane is determined (step 1511). Finally the substrate 320 is placed back into the cassette (step 1512). Step 1510 of unloading substrate from the chamber is further illustrated in FIG. 12. Step 1511 is optional for the system to work.

Figure 1:
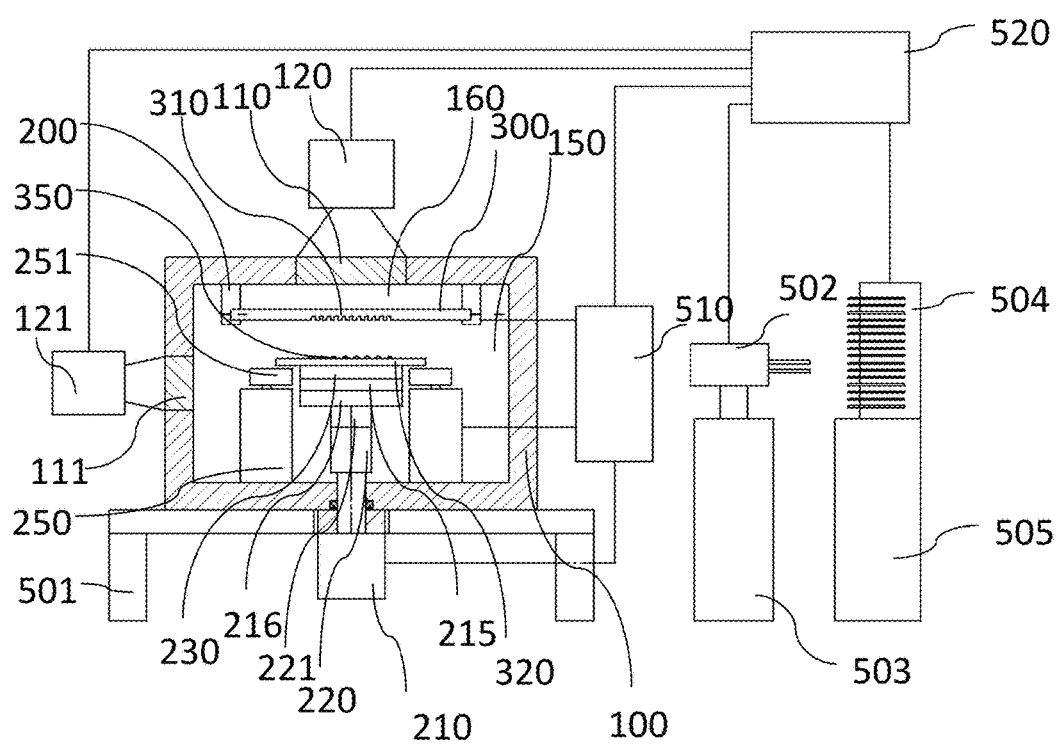
FIG. 1 is schematic drawing of the system illustrating the disclosure.
Figure 26:
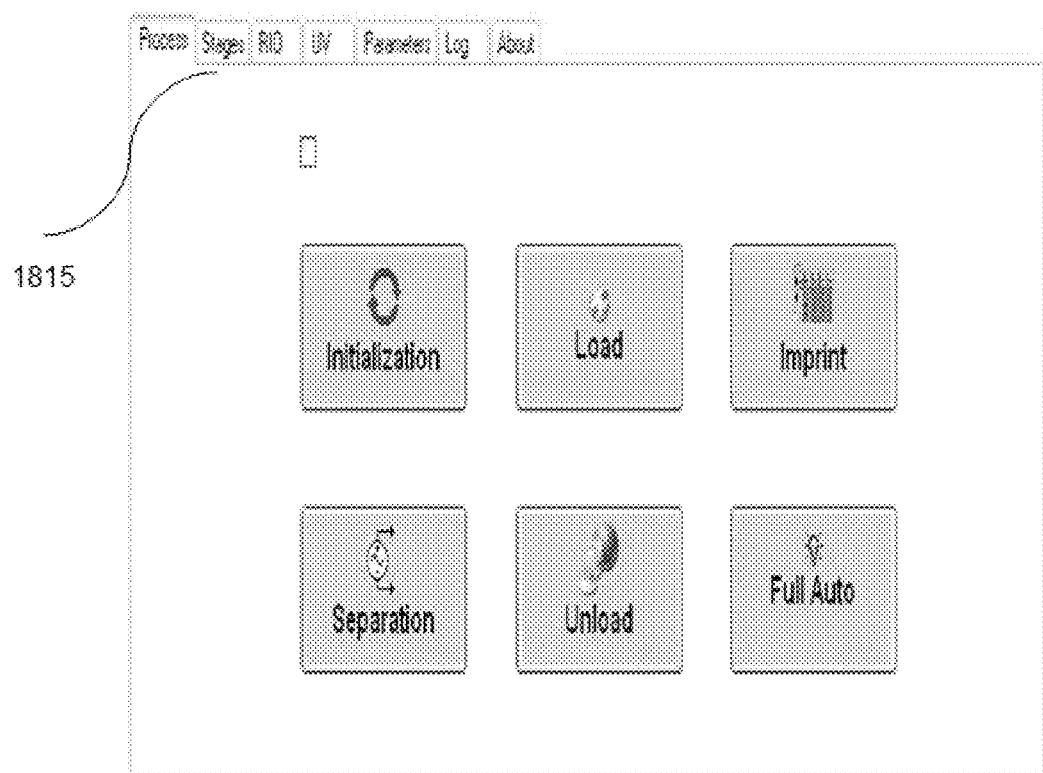
FIG. 26 is a graphic user interface for control software.

In accordance with the concept of the disclosure, referring to FIG. 1, the system has a chamber 100 that can achieve vacuum or pressure inside. The chamber is mounted on a vibration controlled table 501. A multi-axis robot 502 with multiple end effectors is used to pick up from molds and substrates from cassettes 504. The cassettes are seated on front loaders 505. The complete system is controlled by control system and PCs 520. The control software interface is shown in FIG. 26.

Figure 2:
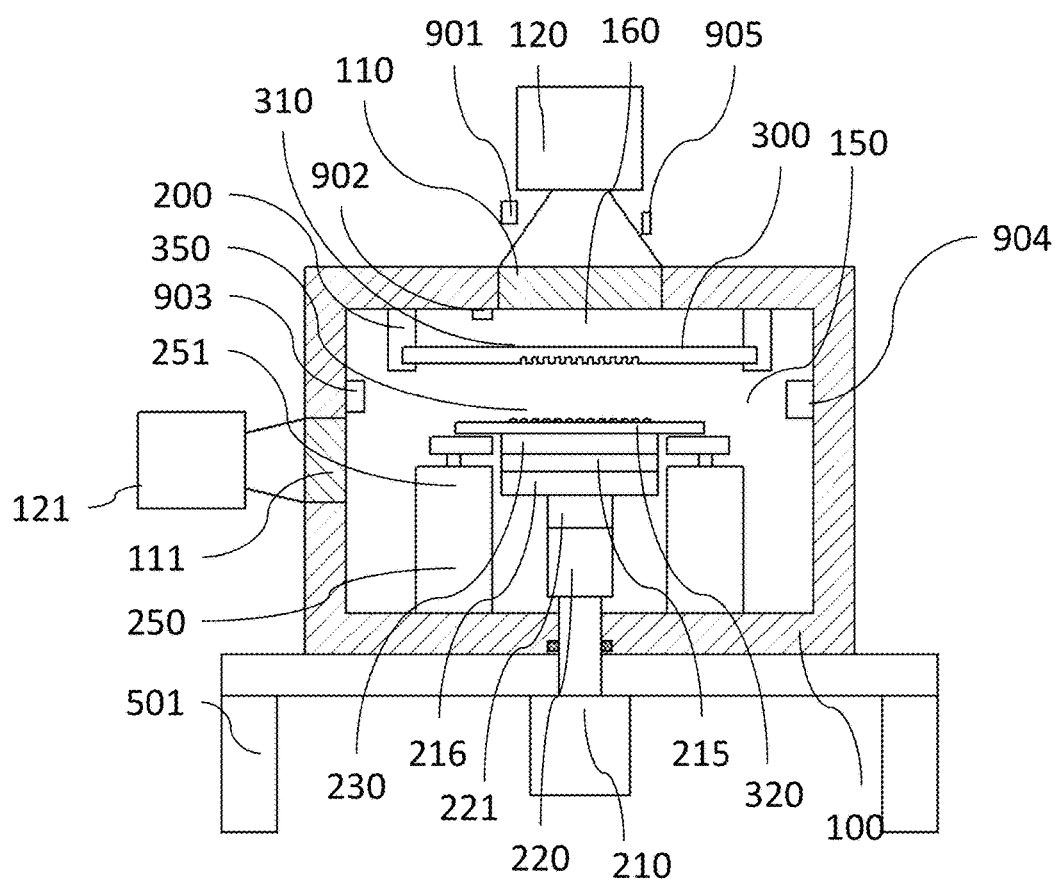
FIG. 2 is a schematic drawing illustrating the process chamber.

Referring to FIG. 2, the top wall of the chamber 100 has a light passing through section 110 while the side wall of the chamber has light passing through sections 111. Section 110 could be an optical transparent window made of quartz or glass. The section is able to hold vacuum seal and built-up pressure inside the chamber during operation. Section 110 allows a UV light passing through to provide UV curing exposure for UV curable imprint, a visible light passing through to view inside of the chamber, and an Infrared light passing through to view inside of the chamber using infrared images. For such purpose, a UV radiation source 120 is mounted outside chamber and right above section 110. An alternative mounting for UV source 120 is to mount the source elsewhere and use a plurality of mirrors to deflect UV light to pass through section 110. The UV sources can also be mounted inside the chamber. In case of doing thermal imprint, the UV radiation source is replaced by heating lamp. Secondarily, section 110 allows viewing inside of the chamber for alignment using microscopes, process monitoring using cameras or laser sensors, or both. The side wall of the chamber has light passing through sections 111. Section 111 could be an optical transparent window made of quartz or glass. The section is able to hold vacuum seal and built-up pressure inside the chamber during operation. Section 111 allows UV lights passing through to provide UV curing exposure for UV curable imprint, visible lights passing through to view inside of the chamber, and Infrared lights passing through to view inside of the chamber using infrared images. For such purpose, UV radiation sources 121 mounted outside chamber and right next to section 111. An advantage of this UV source placement is mold material does not have to be UV transparent anymore. UV light can reach UV sensitive imprint resists through the backside of substrate, or through the side of the substrate, or through the side of the mold, or a mixture of any of the above. An alternative mounting for UV source 121 is to mount the sources elsewhere and use a plurality of mirrors to deflect UV light to pass through section 111. In case of doing thermal imprint, the UV radiation source is replaced by heating lamp. Secondarily, section 111 allows viewing inside of the chamber for alignment using microscopes, process monitoring using cameras or laser sensors, or both. At least one of the windows of section 110 and 111 is coated with multiply layer thin films for reducing light reflections on the window surfaces.

The wavelength of UV is typically between 180-410 nm. Narrow band filters can be used to limit the wavelength. ~365 nm light can be used for exposure. In addition, UV LED light source can also be used. It typically has a central wavelength of 365 nm or 400 nm. UV LED has a long lifetime, constant power density, and can instantly be turned on and off. The advantages of having two opening section 110 and 111 is to allow UV source to cure resists from side and back, therefore non-transparent mold/substrate can be used in the process. Using multiple UV sources to cure resists simultaneously will also reduce curing time and improve the throughput of the machine.

Both substrate and mold are held uniformly on their separate holders with minimum deformation. The substrate can be a standard 2", 4", 5", 6", 8" or larger wafer, while the mold can be a 6"×6"×0.25" thick quartz plate. The substrate can also be a magnetic disk of a given ID and OD. The substrate can also be a 6"×6"×0.25" thick quartz plate.

The mold used for the apparatus can or cannot need to be deformable under a reasonable differential pressure between its two sides. The mold could be made of quartz, glass, polymer, semiconductor, metal or a mixture of some of the above materials with a thickness of about 0.001-25 mm. One example of the mold uses 5" diameter quartz or glass wafer with a substrate thickness 0.2-2 mm; another example of the mold uses 12" diameter quartz or glass wafer with a substrate thickness 0.2-2 mm; one more example of the mold uses 6" diameter Ni substrate with a thickness of 0.1-2 mm; one more example of the mold uses 6" diameter flexible polymers with a thickness of 0.001-2 mm; yet one more example of the mold uses 200 mm diameter Si substrate with a thickness 0.1-2 mm. A combination of above materials can also be used as mold: for example, a 6" diameter quartz or glass substrate with a thickness of 0.2-2 mm can be bonded together with a 4" diameter flexible polymer material with a thickness of 0.001-2 mm to form a mold.

A mold 300 for imprinting is held against a mold holder 200 by using vacuum or mechanical clamp means 201. The mold holder is hollow to permit a central patterned region 310 of mold 300 to be freely accessible from underneath side, top side or both sides. There is a loading rail which allows the mold holder to be slide into the position. Different mold holders can be used to accommodate mold of different dimensions. The surfaces in contact with the mold on the mold holder are uniform, which can hold the mold with a minimum deformation. During operation, the mold holder is loaded into the chamber and firmly attached to inner surface of top wall of the chamber by mechanical means. The mold holder is positioned to have patterned region 310 exposable through section 110, or section 111 or both, and accessible from underneath. An enclosed volume named mold mini-chamber 160 is formed by body of mold holder 200, mold 300 and top inner surface of the chamber wall. Being contrast with mold mini-chamber 160, the rest bulky inner volume of the chamber is referred to chamber volume 150. The chamber is connected with pneumatic lines (not shown) that independently control pumping or pressurizing of mold min-chamber 160 and chamber volume 150. Therefore, both of them can be pumping to vacuum and pressurized and a differential pressure between them can be established when desired. To reduce the chamber volume, long travel Z stage 210 can be placed outside of chamber 100, as shown in FIG. 1 and FIG. 2. Inside the chamber, an optional stage assembly 215 can be mounted. The stage assembly can contain X-Y-Z-Yaw-Pitch-Roll motion controls in order to align the fiducial marks on the substrate to the marks on the mold. The 2 axis Pitch-Roll motion can provide fine adjustment to make top surface of substrate 320 parallel to the patterning surface of the mold 300. A chuck 230 with vacuum grooves on its top surface is mounted on the optional stage assembly 215, which then mounted on top of an optional coarse leveling apparatus 216. A force sensing apparatus 220 is mounted directly on the Z stage 210. Part 221 connects the bottom force sensing apparatus 220 to the top coarse leveling apparatus 216. A substrate 300 for imprinting is held on chuck 230 by vacuum pumping through the vacuum grooves. Surface of chuck 230 are designed and special polished in order to hold the substrates with minimum deformation. The stage assembly is either mechanically installed or capable of moving the substrate within its X-Y travel ranges to superimpose the center of the substrate with the center of patterned region 310 in X-Y plane. The substrate can have a moldable material 350 applied on its side surface facing the mold before imprint begins. The moldable material could be a continuous film layer of imprinting resist spun on or a plurality of droplets of imprinting resist dispensed on. When the moldable material is in form of a plurality of droplets before imprinting, the distribution of the droplets could be a uniform matrix of equal spacing among adjacent droplets along one direction or multi directions, or an arbitrary matrix optimized for merging each to achieve desired imprinted patterns. In additional to these general demands for imprinting, the special distribution of droplets is preferred to deliver a uniform and continuous contacting interface between the mold and the substrate during the imprint process of the apparatus. A seal apparatus 250 and 251 is mounted on the bottom of the chamber. The top of the seal apparatus 251 is capable of moving upward, sealing the edge of the substrate 320 against the mold 300.

There is a gas reservoir of high pressure, with a regulator and piping to allow delivery of high pressure gas. There is also at least one vacuum pump to provide source of vacuum. Vacuum accumulator is also built inside the system to deliver vacuum more efficiently and maintain a vacuum when the system power is off. Both the mini-chamber and main chamber have separate pressure and vacuum control, with separate gas content and vacuum delivery, and separate gas flow rate and gas flow in/out control. In addition, the chuck to hold substrate on the backside also has same vacuum and gas control capability. There are multiple regulators, and manifold in the system as well.

Figure 17:
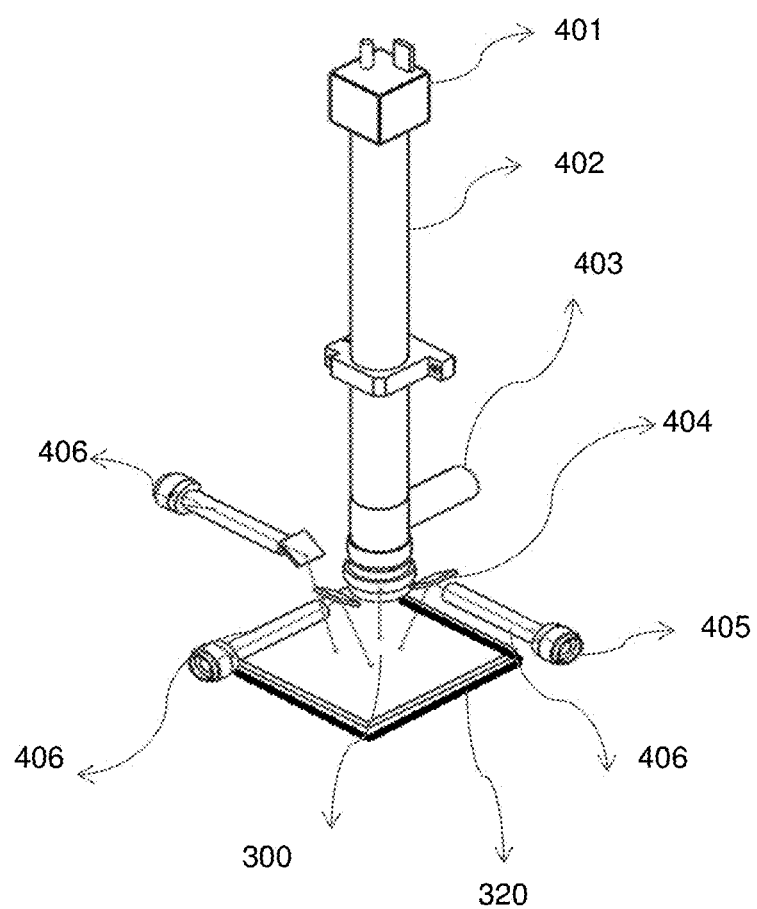
FIG. 17 is a schematic drawing of the alignment apparatus of the system.

Referring to FIG. 17, alignment apparatus in the system has four microscopes. Three of them are titled while one of them is vertical. The vertical microscope has higher NA than the other three titled microscopes, and is used for coarse alignment of substrates to the mold. The titled microscopes will use moiré alignment marks on both the mold and the substrate to read the miss-alignment between them at different locations. Depending on the type of mold to be used, the wavelength of illumination lights for the microscopes can be either in visible or IR (800 nm-2000 nm) range. To prevent illumination lights from exposing the imprint resists, UV block filters are used in the illumination paths. Alternatively, two vertical microscopes can also be used for both the coarse and fine alignment.

Substrate thickness measurement sensors 901, 902 can be mounted either outside chamber or inside chamber as shown in FIG. 2. Substrate and mold gap sensors 903, 904, 905 can also be mounted either outside or inside chamber.

Figure 13A:
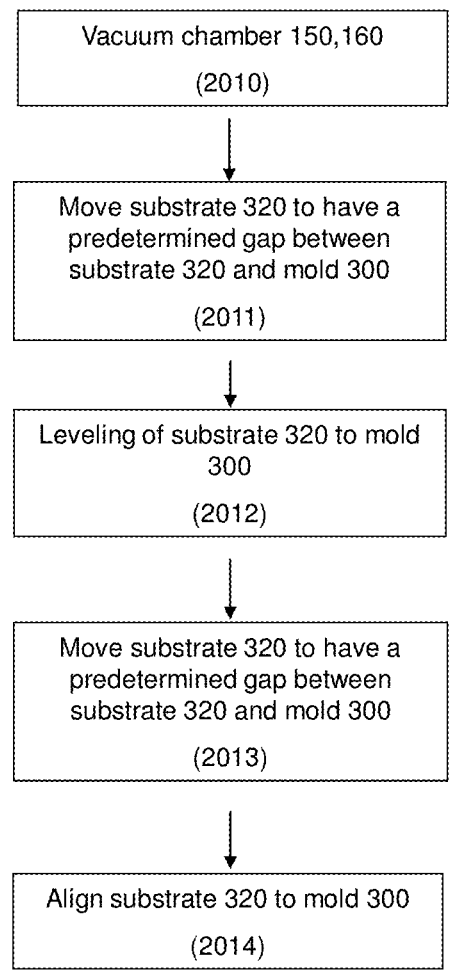
FIG. 13a-b is a flow chart to show detail steps of process carried out inside the process chamber.
Figure 13B:
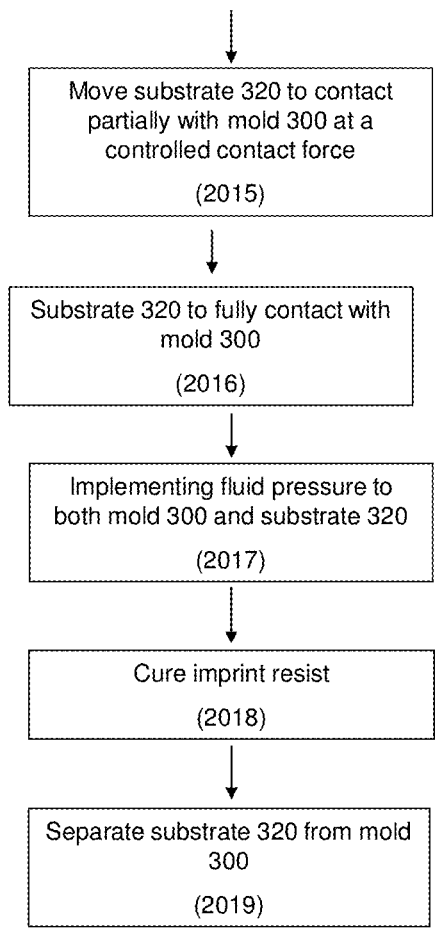

Referring to FIG. 4, the step 1112 of alignment, imprint, and separation process carried out inside chamber is further illustrated in FIG. 13*a-b*.

Figure 3A:
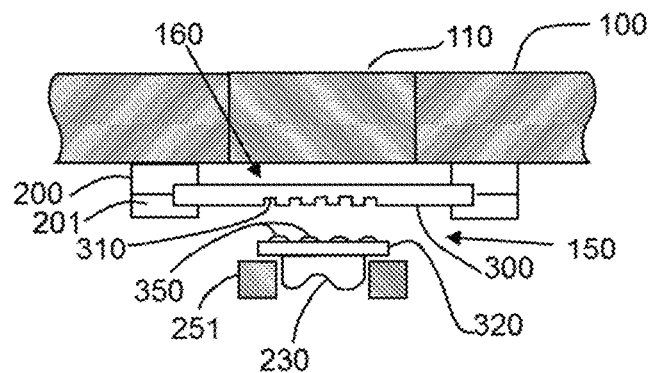
FIG. 3a-3d illustrates operation process of the apparatus illustrating the disclosure.

Referring to FIG. 3*a*, mold holder 200 and mold 300 is loaded into chamber 100 and firmly attached to top plate of the chamber wall by cylinders or similar mechanical means 201. Substrate 320 with moldable material 350 on its top surface is held against chuck 230 by pumping through the vacuum grooves and positioned beneath the opening of mold holder 200. As shown in FIG. 13*a*, step 2011, at beginning of the imprint process, substrate 320 is positioned to a starting position which normally has a larger than 0.5 millimeter gap between the substrate and the mold. Gap measuring sensors are used to detect mold and substrate gaps at 3 different locations. Then the substrate is adjusted until all the gaps are the same. This means the substrate surface is in parallel with the mold surface. Alternatively, the gap can be measured using microscopes and alignment marks on the mold and substrate. In addition, by observing the interference pattern between the mold and the substrate, the substrate surface can also be adjusted to be in parallel with the mold surface.

Figure 3B:
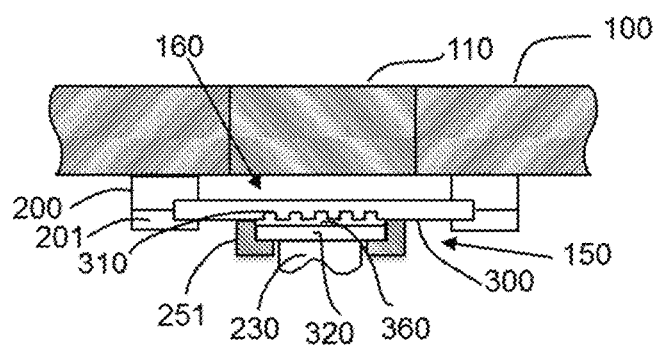

Referring to FIG. 3b, next step of the imprint process is to pump chamber volume 150 and mold mini-chamber 160 to remove air. This pumping step facilitates to reduce trapped air defects of imprinted patterns. Typically a vacuum of about 0.1 to 25 torr is required. An extra pneumatic line is equipped with the machine which allows special gas with fast diffusion such as Helium to be used to facilitate the removal of air in the chamber.

Aligning the substrate with the mold can be finished before the pumping or in the pumping. Normally, aligning the substrate and the mold is accomplished by positioning an align marker on the substrate overlapping with a matching align marker on the mold under microscopes. To prevent possible shift of the substrate on chuck 230 during the pumping, both the substrate and mold are mechanically clamped in positions. By using the vertical microscope and alignment marks on the substrate and mold, the substrate is first moved to coarsely align with the mold. This will remove the small error generated during loading and machine assembling, and make sure the fine alignment marks on the mold and substrate are located in the same field of view, therefore no further searching of alignment marks necessary, significantly improving the alignment speed and reliability, which are required for manufacturing. Referring to FIG. 17, if fine alignment (<250 nm) is required, the 3 titled microscopes will then read mis-alignments at 3 different locations by using the fine alignment marks. The finer X, Y, and rotation error can be corrected by substrate stages 215. Alternatively, 2 vertical microscopes can be used to read mis-alignment using moiré patterns, realizing fine alignment.

The substrate can be moved up to contact with the mold under a controlled push by the Z stage 210 and stage assembly 215. The top moldable surface on substrate 320 is adjusted in parallel with mold molding surface by the coarse leveling mechanism 216 and optional fine leveling mechanism stage assembly 215 before the final contact. Optical sensors (not shown) and force sensors 220 can be used to locate the exact contacting point and contact force. To accomplish the contact step, substrate 320 is moved up slowly until there is a slight controllable contact force between the mold and substrate reached. Then the substrate is continued moved up while the Pitch-Roll of the stages are adjusted to keep the contact force low. Then the mold is released from the mold holder by removing the mechanical clamp and holding vacuum. Under the gravity force, the mold 300 will move down to contact the substrate 320 with the two facing surfaces of 300 and 320 in parallel. The initial contact force prevents relative movement between the mold and the substrate, therefore maintaining the relative position between them. The resist forms a continuous film to seal the edge, which allows the fluid pressure to be later applied during imprint.

The force sensing apparatus has a sensitivity of a few 0.5 grams, with a reading range of a few grams to 40 kg. It is very useful in contacting and separation. During contact, by minimizing the initial contact force, the contact surfaces of mold and substrate can be maintained to be in parallel while contacting. User can also set the final contact force to control how much the mold and substrate surfaces to contact each other. During separation, a sudden change of the force indicates the separation is finished. The other way to tell whether a separation is successful is through the substrate chuck vacuum reading. During separation, while the substrate chuck is moving away from the mold, and if the substrate is still sticking to the mold, the vacuum level of the substrate chuck will drop. In one setup, the reading of vacuum can drop a few PSI, which can be easily detected by a vacuum sensor. The system will therefore run the recovery procedure to either separate again or remind user what is happening.

When the moldable material applied on the surface of substrate is by spin on method, it is preferable to form the contact by pushing up the seal ring 251 against the mold. The mold in this case can have a larger size than the substrate. For example, a 6" diameter mold can be used to imprint a 2" or 4" substrate. When both chamber and mini-chamber have been vacuumed to a suitable level, the vacuum to hold substrate 320 will be removed. Then the seal ring 251 will move up to push the substrate to be in further contact with the mold. As the top surface of 251 is covered by deformable seal material (such as rubber), the edge of the substrate will be sealed off. The bottom of the seal ring 250 is mounted on the bottom of the chamber. The seal ring is driven by an air cylinder with pressure adjustable from 0-90 psi. Alternatively piezo stage and solenoid with controlled force can also be used to drive the ring. The push up force and speed of the seal ring 251 can be fine adjusted so there is no damage to the mold and substrate, and the edge can be securely sealed against fluid pressure. 30-90 psi pressure was found sufficient and used to press on the seal ring. The material used on top of seal ring can have various thicknesses, ranging from $1/16"$-$1/4"$. It can be a clean deformable material such as TEFLON, VITON, silicon, or KELREZ or a combination of two or more of these materials. The deformable material can be bonded to a metal ring first using glue, epoxy or screws. Then the metal ring is mounted on top of the movable seal ring using either magnets, or screws.

A different way to form the contact is realized by deforming the mold. Referring to FIG. 13a, 13b, step 2011, the substrate is positioned to have a predetermined gap between the mold 300 and the substrate 320. Then, the mold is deformed to press against the substrate by implementing a differential vacuum or pressure between mold mini-chamber 160 and chamber volume 150. The center of the mold, where has the most significant deformation, firstly contacts with the substrate. As the differential vacuum or pressure increases, the contact expands from the center to periphery. At a specific differential vacuum or pressure, full area of the substrate contacts with the deformed mold. The differential vacuum and pressure necessary to establish the full area contact is determined by major factors such as overall dimensions, peripheral clamping, body thickness and material of the mold, gap prior to deforming mold, and, overall dimensions of the substrate. During establishing the full area contact, moldable material 350 under press of the contact redistributes to form an intermediate layer of continuous film. Next, vacuum pumping from the back side of the substrate 320 through the vacuum grooves is removed to make the substrate releasable from the chuck 230. At last, the mold 300 is restored to its original shape by removing the differential vacuum or pressure while retaining the contact with the substrate 320. The intermediate moldable material provides adhesion necessary to retain the contact between the mold and the substrate. This method can be further improved by setting a smaller predetermined gap between the mold and substrate before mold deformation. Then when a higher differential pressure is applied initially to deform the mold, the patterning area of the mold contacts all the surface area of the to be patterned substrate at the same time. This method of contacting all the imprint area at the same time instead of contacting a partial area first can significantly reduce the deformation of local patterns during imprint, therefore improves the pattern transfer fidelity. As we can see, the deformed area of the mold is at least the same or bigger than the surface area of the substrate that requires to be patterned at this time. Deforming a portion of substrate to be in contact with the mold will work the same way as above.

A new way to have fluid pressure imprint, one can also maintain the initial differential pressure between 160 and 150 during the complete imprint cycle. This pressure difference is used to seal the edge of imprint resist against fluid pressure inside chamber. Then the pressures of both the mini-chamber 160 and chamber 150 can be increased to their final imprint values while still keeping their pressure difference to be the same. A pressure difference of a few PSI is sufficient to seal the edge of the resist. In the process, the pins on the substrate chuck can also be controlled to have a same fluid pressure as the chamber 150, therefore applying an upward fluid force to the backside of the substrate.

Figure 14:
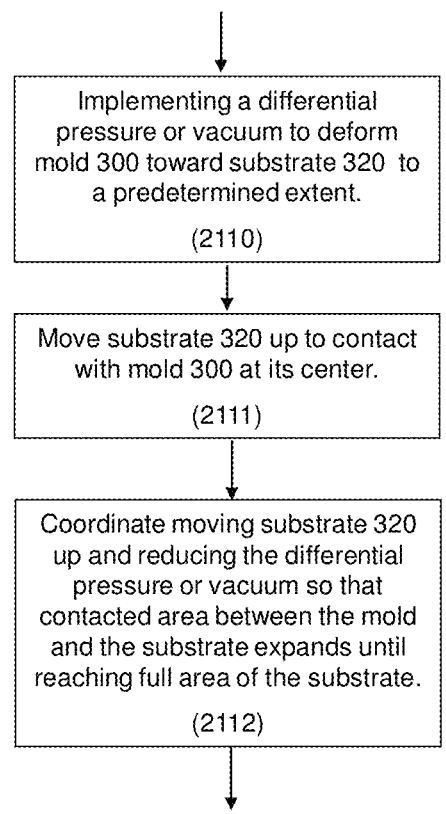
FIG. 14 is a flow chart to show detail steps of contacting substrate with mold.

Referring to FIG. 14, another alternative way to accomplish the contact step of FIG. 3b is to deform the mold at a predetermined extent and move the substrate up against the deformation. At first, referring to step 2110, the mold is deformed toward the substrate to a predetermined extent by implementing a differential pressure or vacuum between mold min-chamber 160 and chamber volume 150. The optimal condition for the predetermined extent of deformation is affected by substrate thickness variations and variations of surface parallelism between mold 300 and substrate 320. The predetermined extent of deformation prefers to have the center of the mold deformed downward by 0.05-0.5 millimeters. Then, referring to step 2111, substrate 300 is moved up to contact with deformed mold 300 at its center where maximum deformation occurs. After that, referring to step 2112, moving substrate 300 up is coordinated with reducing the differential pressure or vacuum so that contacted area between the mold and the substrate expands accordingly until reaching full area of the substrate. The step can be realized by repeating small changes of moving the substrate and reducing the differential pressure or vacuum. It is desired that the mold is restored to its original shape when the full area contact is reached. The process of making the contact does not depend on adhesion provided by intermediate moldable material 350 and is able to squeeze any residual air out of interim region between the mold and the substrate. Thus, it can be conducted at atmosphere without causing serious trapped air defects for imprinted patterns.

When the contact step of FIG. 3b is accomplished, the moldable material has been pressed lightly and redistributed to fill space between the mold and the substrate. For case of using very low viscosity moldable material, the press caused by the contact can be sufficient to imprint patterns of the mold into the moldable material. In order to guarantee quality of patterns imprinted, it may need to apply higher pressure press on the mold and the substrate than the contact. Depending on the thickness of the substrate and mold, a typical −14.6-1000 psi can be applied to further imprint. Typical gases used for imprint can include one or more of non-reactive gases such as nitrogen, air, argon, helium etc.

Figure 3C:
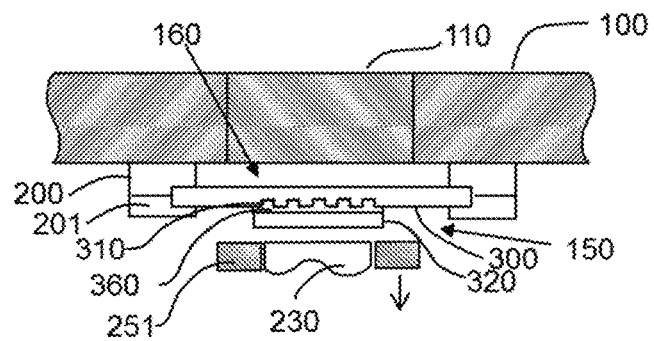

Referring to FIG. 3c, higher pressure press is applied on the mold and the substrate by filling mold mini-chamber 160 and chamber volume 150 with high pressure gas. Air Cushion Press (ACP) is fully realized during this step for imprinting. Details of Air Cushion Press are described by Stephen Y. Chou in U.S. Pat. No. 6,482,742 under a title of "Fluid Pressure Imprint Lithography", which is herein incorporated by reference. The ACP realized herein either relies on the edge seal by 251 in order for ACP to work properly, or it depends on the prior contact and the intermediate moldable material to seal the contacting periphery of the mold and the substrate. Chuck 230 and seal ring 251 can be moved away from contacting the back side of the substrate during this step so as not to degrade pressing uniformity of ACP. After reaching desired pressure for ACP, the moldable material redistributes to completely fill every space between the mold and the substrate, then, is consolidated to solid by a UV exposure through section 110, or section 111, or both. Finally, the high pressure gas for ACP is vented to atmosphere. So far, pattern formation of imprinting is completed. The substrate is ready for being released from the mold.

Figure 3D:
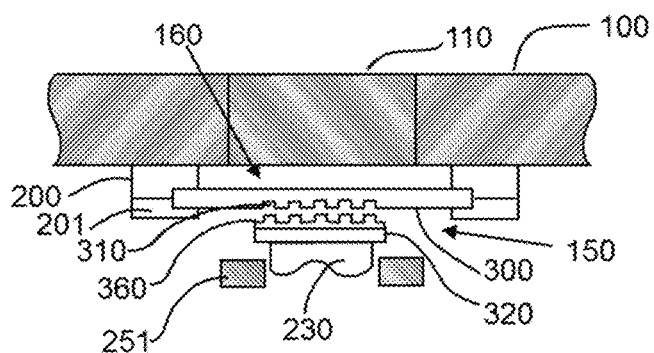
Figure 15:
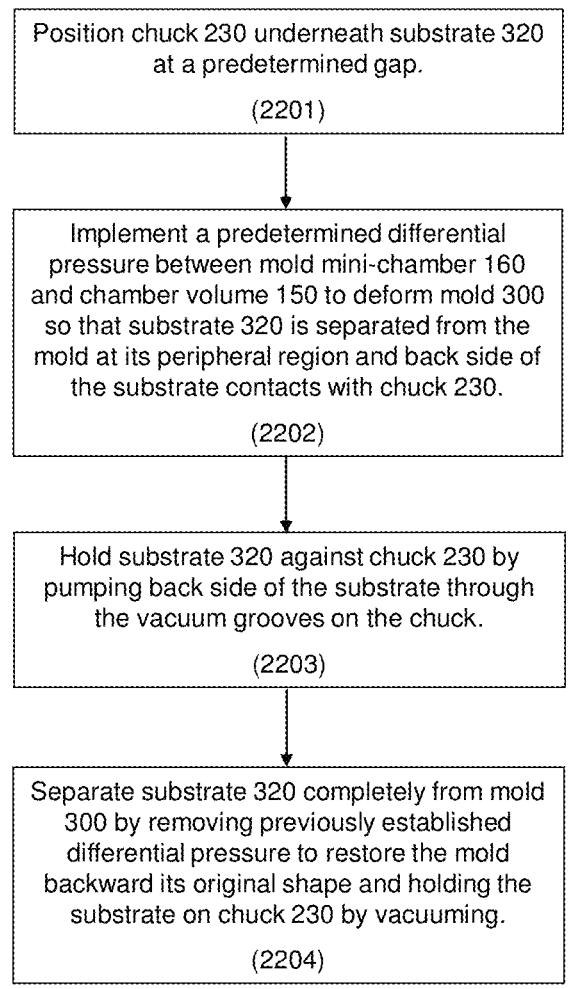
FIG. 15 is a flow chart to show detail steps of separating substrate from mold.

Referring to FIG. 3d, the substrate is separated from the mold. The separation can be realized by combining mold deformation and stage movement. FIG. 15 illustrates a way to separate the substrate from the mold. Referring to step 2201 of FIG. 15, the separation starts from positioning chuck 230 underneath substrate 320 at a predetermined gap. Then, referring to step 2202, a differential pressure between mold mini-chamber 160 and chamber volume 150 is introduced to deform the mold. As deformation is enlarged by increasing the differential pressure, substrate 320 loses contact from the mold starting from periphery and expanding toward center. Meanwhile, substrate 320 is lowered down until it is supported by chuck 230. The differential pressure reaches a predetermined value so that back side of substrate 300 completely contacts with chuck 230. By now, a significant peripheral region of the substrate is released from the mold and central region of the substrate is not yet. After that, referring to step 2203, the substrate is held against chuck 230 by pumping back side of the substrate through the vacuum grooves on the chuck surface. Finally, referring to step 2204, the established differential pressure is removed to restore the mold backward its original shape. Because the substrate is vacuum held against the chuck, the remaining central area of the substrate is separated from the mold. The substrate stays on chuck 230 after the separation and the mold is returned to its starting status.

Figure 16:
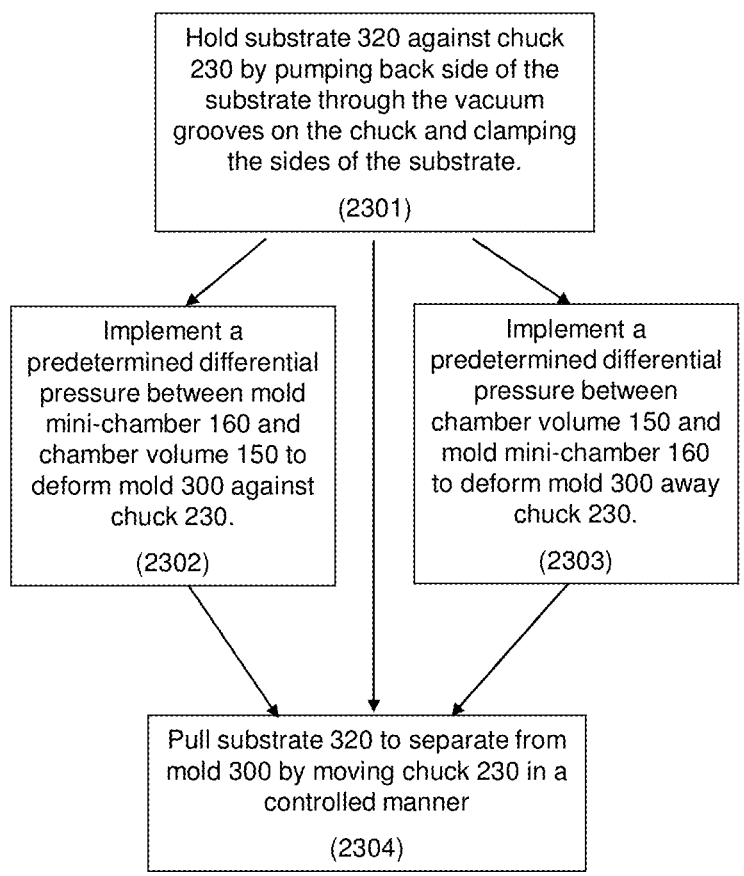
FIG. 16 is a flow chart to show detail steps of separating substrate from mold.

Alternative ways to separate the substrate from the mold are illustrated in FIG. 16. These ways share a common concept that use both vacuum and mechanic means to hold the mold and the substrate, and create a relative movement between mold and substrate to separation. The movement can be a pull on the substrate in certain way using the stage assembly to create the motion to separate. The mold can be intentionally deformed to further facilitate the separation. Referring to step 2301 of FIG. 16, the separation starts from vacuum holding back side of substrate 320 against top surface of chuck 230 by pumping through the vacuum groves on the chuck. If chuck 230 is away from the substrate, the chuck is positioned to contact back side of the substrate by the stage assembly prior to the vacuum holding. Referring to step 2304, one way to separate is to pull substrate 320 downward by moving the stage assembly down. Because the substrate is held against the vacuum grooves on the chuck and the mold is deformable, at beginning of the pull, the mold is deformed so that periphery of the substrate is separated first. As the downward pulling is progressing, the separated region of the substrate propagates from the firstly separated periphery inner ward the center. At end of the downward pulling, the substrate is completely separated from the mold. To improve this separation process, referring to step 2302 prior to step 2304, a predetermined differential pressure is implemented between mold mini-chamber 160 and chamber volume 150 to deform the mold against chuck 230. Present of the differential pressure makes the mold more easily deformable when the substrate is pulled downward. Thus, the separation is improved to be more easily and reliably. The differential pressure is predetermined so that the mold is not under risk of rupture when the substrate is separated and the chuck is moved away. Referring to step 2303, it can also implement a reverse differential pressure between mold mini-chamber 160 and chamber volume 150 to deform the mold away chuck 230. In such way, the mold is more easily deformed away the substrate to improve the separation when the substrate is pulled downward. This reverse differential pressure is predetermined not to risk the mold for any possible rupture when the substrate is separated. For this case, a supporting surface could be specially designed on inner top wall of the chamber to limit maximum reverse deformation of the mold. After the substrate is separated from the mold, any differential pressure implemented previously is removed to restore the mold to its original shape.

Alternatively, the separation motion of the substrate can be much more complex than a simple downward pulling motion to best separate the substrate from the mold, reducing the possible damage to nano-scale patterns and improving separation speed. The stage holding the substrate in the system can be capable of 6 axis motion movements, therefore the substrate can move with its motion and speed accurately controlled. The separation can include movements of multiple steps with the speed and direction of each movement be controlled. In one example, the substrate moves in both Roll and Pitch motion, and at the same time moves down in Z: the combination movement will peel the substrate from the mold diagonally. In another example, the separation include 2 step movements: first the substrate moves down in Z while going through Roll motion, then it moves down in Z going through Pitch motion.

The relative movement for separation can also be generated by springs, stage driven flexures, inflatable O-rings and other mechanical means. The relative movement can also be generated by gas flow. When one corner of the mold/substrate is started to separate, gas flow can be introduced in between mold/substrate, preferably vertical to the direction of separation front. The flow rate and gas pressure can be controlled for best result. A mixture of above methods will work. For example, an inflatable O-ring (in the mold holder, mold, or substrate holder) can push locally the corner of the imprinted die to create an initial separation. Then an air flow, preferably vertical to the separation front line, can be used to assist the propagation of the separation.

Figure 19A:
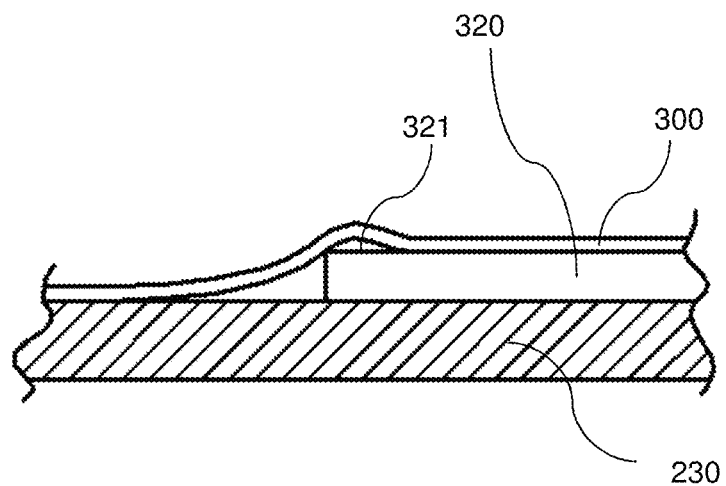
FIG. 19a-b illustrates process of imprint without and with edge support.
Figure 19B:
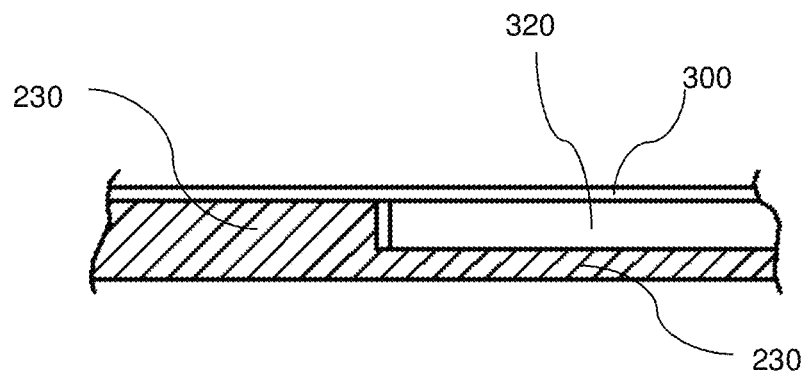
Figure 20:
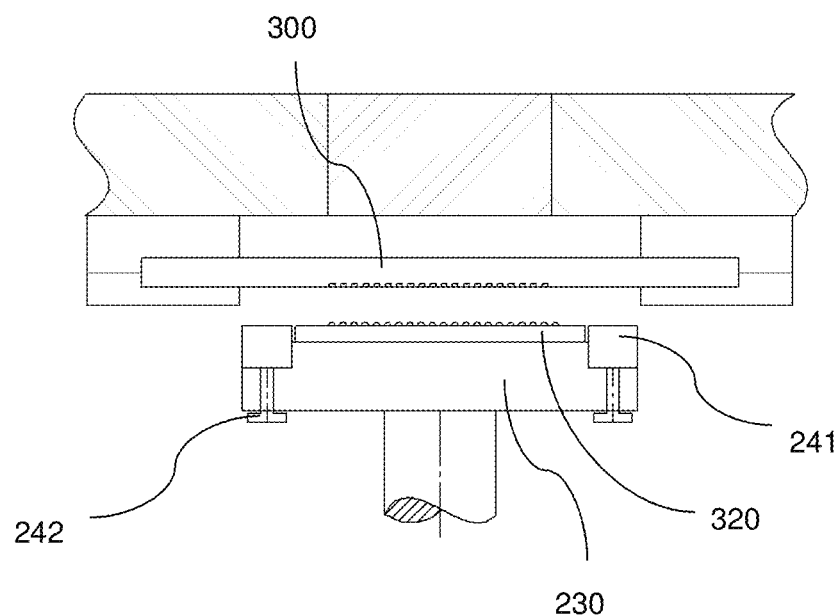
FIG. 20 is a schematic drawing of system using edge support on substrate holder.
Figure 21:
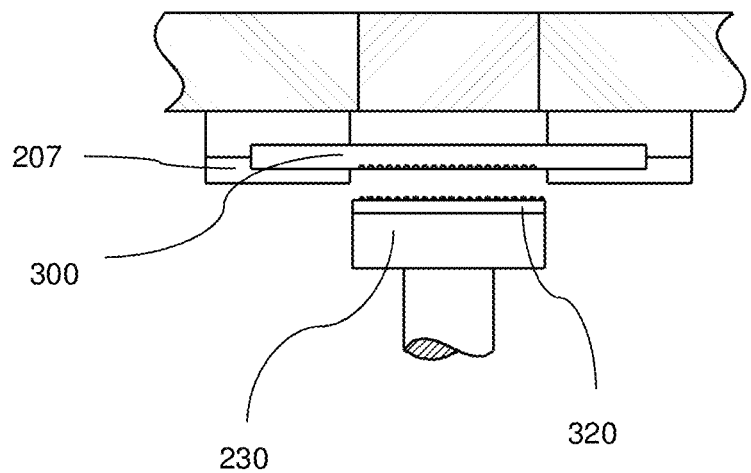
FIG. 21 is a schematic drawing of system using support on mold holder.

As shown in FIG. 19A, during imprint, at the edge of the substrate 320 or mold 300, due to the height difference and material bending, the edge of the substrate 321 may not be imprinted. A mold supporting assembly will be effective to solve this problem allowing imprinting all the way to the edge of the substrate 321. As shown in FIG. 19B, 236 of the chuck now acts as the mold supporting assembly which reduces mold bending as the edge and keep it relatively flat throughout the surface, therefore imprint all the way to the edge of the substrate. The mold supporting assembly can be mounted on the substrate holder, as shown in FIG. 20: the height of spacer 241 can be manually adjusted by setting screws 242. Adjusting 241 to be at about the same height as the substrate allows imprinting all the way to the edge of the substrate 320. A height variation of 100 um has also been found to be successful. The mold supporting assembly can also be mounted on the mold holder, as shown in FIG. 21: spacer 207 can be mounted on the mold holder, therefore acting as a support for mold, limiting its bending around the edge of substrate, allowing imprinting all the way to the edge. In this case, the center opening diameter of 207 needs to be slightly larger than the diameter of the substrate. A 0.01-2 mm diameter difference has been tested to be successful. If there is big variation of substrate thickness, sensors in the system will then measure the substrate thickness in real time. The thickness information is then sent to the Z stage to move it up or down during imprint in real time. The spacer 241 and adjustment screws 242 can be mounted separately from the Z stage as well to facilitate the adjustment. This will allow the Z stage to dynamically move according to the substrate thickness, therefore keeping a minimum bending of mold at the edge of the substrate.

Figure 22:
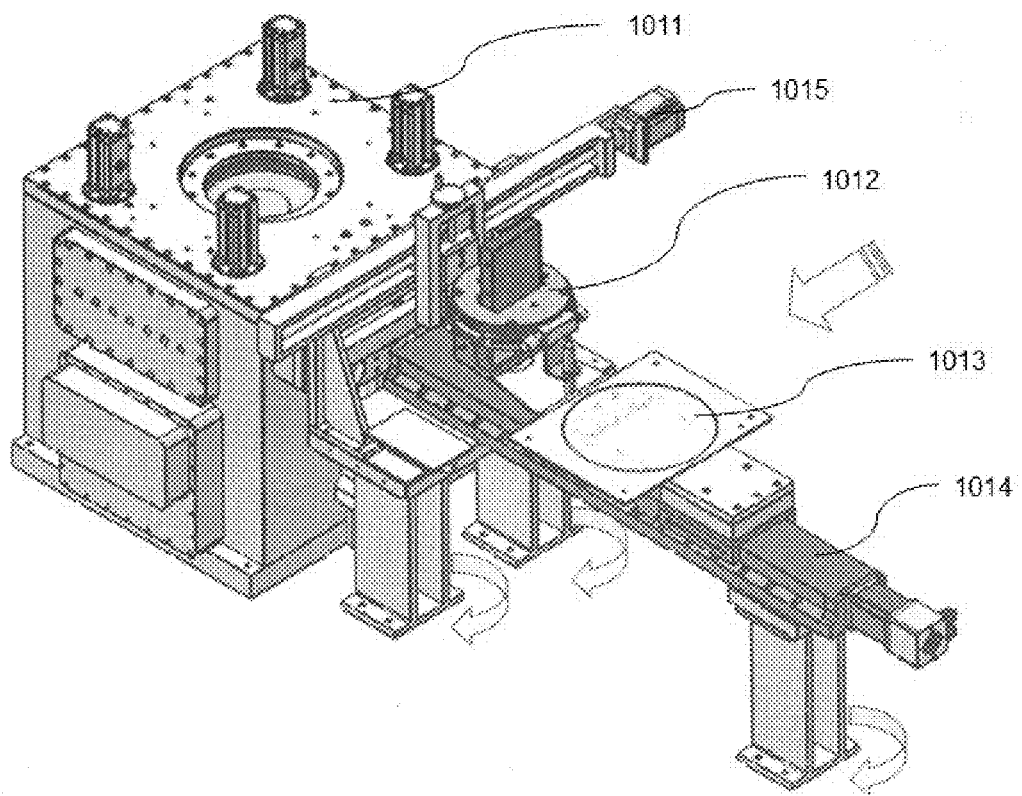
FIG. 22 is a schematic drawing of system showing optional dispensing system.

The system disclosed here can include a dispenser system to apply low viscosity (1-200 cP) resists on substrates. As shown in FIG. 22, the dispenser head is mounted on a rotation stage for resist droplet spacing adjustment. It also has a Z stage to adjust the head position to dispense on the substrate, contact with the cleaning station, and for camera observation of the resist droplets. A resist reservoir and pump is also attached to the head for continuous supply of resists during manufacturing. The dispenser head has 16-256 nozzles with a natural spacing of about 128, 256 or 512 um between them. There is also a long travel stage on the dispenser gantry which is vertical to the long substrate stage. They provided the necessary movement in X-Y to dispense on substrate. In addition, there is a resist dispensing observation system. A LED light source is used as illumination for the microscope and camera. To avoid exposure of UV resists, a yellow filter is installed on the light source. The light source is synced with the frequency where the resist droplets are fired from the dispenser head, so the droplets can be seen and captured by the camera. By adjusting the dispensing profile (include the frequency, driving voltages, voltage profiles), an optimized and uniform dropping on substrate can be achieved.

During loading of the substrate, the substrate will pass underneath the dispenser head for deformable material dispensing. The gap between head and substrate during dispensing can be range from 100 um to 25 mm. Each droplet size can range from 1-100 pL. In the center of the dispensing system is a cleaning pad. It can move in contact with the bottom of the dispenser head to wipe out the extra resists to keep it clean. The bottom of the cleaning station is connected to the exhaust. By using a dispensing head with multiple nozzles (16-256), and firing of droplets at >10 KHz, the droplets can be coated on the substrate on the fly, while loading, satisfying the high speed requirement of manufacturing. As the width of the dispenser head is from 1"-4", substrate with width wider than 4" would need multiple heads. The firing frequency f (Hz) of the dispenser head and the moving speed v (m/s) of the robot arm will determine the gap between droplets along substrate moving direction to be: v/f*1e6 (μm).

The improvements possessed by the disclosure are emphasized again herein. The apparatus embodiments described in the disclosure accomplish a full cycle of imprinting inside the chamber through a process essentially involving deforming the mold and positioning the substrate by the stage assembly. The speed to finish each step of the process is primarily decided by stage response and how fast to deform the mold. Using state-of-art stage technology, stage response can be very fast and capable of responding to requests of each step well within seconds. Furthermore, the chamber uses vacuum to eliminate possibility of trapping air between the mold and the substrate. The Z stage required for the process is placed outside of chamber, which significantly reduced the chamber volume, therefore reduced the time for vacuum and pressure the chamber, increased the throughput. A few different approaches to carry out fluid pressure imprint are presented here. One is to use a special ring seal design inside chamber, which allows double side intrinsic Air Cushion Press (ACP) of the process to be carried out for nanoimprint. The other approach is to use a small differential pressure to bend mold and seal the edge of the resist. One more approach is relying on the resist merging to form a continuous film. A small force, which can be as little as the weight of mold, can be applied to assist this process. The fluid pressure imprint not only provides very uniform imprinting force to achieve high pattern transfer fidelity, but also reduces possible damage to the imprint molds and substrates, both can provide a significant advantage during manufacturing. By using mold support assembly (with suitable thickness spacers) mounted either on the substrate holder or mold holder, one can imprint all the way to the edge of the substrates regardless the thickness variation of the substrates, which improves the yield for manufacturing.

It is to be understood that the above described embodiments are illustrative of only a few of the many embodiments that can represent applications of the disclosure. Numerous and varied other arrangements can be made by those skilled in the art without departing from the spirit and scope of the disclosure.

When describing elements or features and/or embodiments thereof, the articles "a", "an", "the", and "said" are intended to mean that there are one or more of the elements or features. The terms "comprising", "including", and "having" are intended to be inclusive and mean that there can be additional elements or features beyond those specifically described.

Those skilled in the art will recognize that various changes can be made to the exemplary embodiments and implementations described above without departing from the scope of the disclosure. Accordingly, all matter contained in the above description or shown in the accompanying drawings should be interpreted as illustrative and not in a limiting sense.

It is further to be understood that the processes or steps described herein are not to be construed as necessarily requiring their performance in the particular order discussed or illustrated. It is also to be understood that additional or alternative processes or steps can be employed.

What is claimed is:

1. A method comprising:
    depositing a deformable material on a surface of a substrate;
    positioning in a chamber the substrate comprising the deposited deformable material to face a mold surface of a mold having nanostructures-, wherein the substrate and the mold surface comprise a gap there between, and wherein the chamber comprises a mini-chamber adjacent the mold;
    applying a vacuum in the chamber;
    sealing at least a portion of the surface of the substrate and the mold surface by pressing a movable ring to contact an edge of the substrate and push the substrate to bring the deformable material into contact with the mold surface,
    wherein the sealing comprises at least one of (i) deforming at least a portion of the mold to contact the substrate, and (ii) deforming a portion of the substrate to contact the mold, wherein the deforming is performed by applying a predetermined differential pressure between the chamber and the mini-chamber to a final imprint pressure while maintaining at least an initial pressure difference;
    pressing the mold and substrate for a predetermined period of time; and
    separating the substrate and the mold, the deformable material remaining on the substrate and being patterned with nanostructures corresponding to the nanostructures of the mold surface.

2. The method of claim 1, wherein the sealing further comprises
    determining distance of the gap;
    adjusting at least one of the substrate and the mold until the distance of the gap reaches a predetermined value; and
    sealing at least a portion of the surface of the substrate and the mold surface.

3. The method of claim 1, wherein the pressing comprises:
    applying at an initial predetermined/controlled pressure one or more gases in an area of the chamber that is proximate to the mold and the substrate;
    retracting the the movable ring from the sealing surface;
    applying at a final predetermined/controlled pressure one or more gases in an area of the chamber that is proximate to the mold and the substrate; and
    removing the applied gases to return the pressure to atmospheric pressure.

4. The method of claim 3, wherein the initial predetermined/controlled pressure and the final predetermined/controlled pressure are independently selected from a range between about 14.6 psi and about 1000 psi.

5. The method of claim 3, wherein the one or more gases is selected from the group consisting of nitrogen, air, argon, and helium.

6. The method of claim 3, wherein the movable ring comprises one or more flexible materials mounted on a side of the movable ring for contacting at least one of the mold and substrate.

7. The method of claim 1, wherein at least one of an area of the deformed portion of the mold and an area of the deformed portion of the substrate is larger than an area that requires patterning.

8. The method of claim 3 wherein applying at least one of the initial predetermined/controlled pressure and the final predetermined/controlled pressure comprises applying upward uniform fluid pressure on the substrate so the opposing sides of the substrate and the mold freely contact each other.

9. The method of claim 1, wherein the separating comprises:
    retaining at least a portion of a non-contact side of the mold that is opposing the mold surface;
    retaining at least a portion of a non-contact side of the substrate that is opposing the surface having the deformable material deposited thereon;
    moving the substrate away from the mold in a series of controlled motions until the substrate is released from the mold, said controlled motion being controlled for movement (i) in one or more of 6 axes including x, y, z, theta, tip, and tilt, and
(ii) including one or more control factors selected from the group consisting of distance, motion, force speed, acceleration, deceleration, and time.

10. The method of claim 1, wherein the separating comprises
retaining at least a portion of a non-contact side of the mold that is opposing the mold surface;
retaining at least a portion of a non-contact side of the substrate that is opposing the surface having the deformable material deposited thereon;
deforming the mold until a peripheral region of the substrate is released from the mold, said deforming being effected by a differential pressure between two opposing sides of the mold; and
restoring the mold to its original shape until the substrate is released from the mold.

11. The method of claim 1, wherein the applying the vacuum comprises reducing a pressure from the gap between the mold surface and the substrate to a value selected from between about 0.1 and about 25 torr.

12. A system comprising:
a mold holding fixture for holding a mold having a mold surface with nanostructures;
a substrate holding fixture for holding a substrate having a substrate surface;
a stage assembly having at least one axis movement;
a contact force sensor positioned for sensing a contact force between the mold surface and the substrate surface;
a chamber housing defining a chamber having at least the mold held by the mold holding fixture and the substrate held by the substrate holding fixture positionable therein, the chamber housing constructed and arranged to have a pressure applied therein, wherein the pressure is higher or lower than about atmospheric pressure, wherein the chamber comprises a mini-chamber disposed therein adjacent the mold, and wherein the chamber and the mini-chamber are constructed and arranged to (i) deform at least a portion of the mold to contact the substrate, and/or (ii) deform a portion of the substrate to contact the mold by applying a predetermined differential pressure between the chamber and the mini-chamber to a final imprint pressure while maintaining at least an initial pressure difference;
a mold supporting assembly which provides support to reduce the mold deforming at certain area of the mold, or a movable ring to support and seal the edge of substrate and mold accomplished by pressing the movable ring to contact the edge of the substrate for pushing the; substrate to be in further contact with the mold;
a pressure regulator and a manifold each being fluidly coupled to the chamber for changing the pressure inside the chamber;
a gas reservoir of high pressure, a regulator and piping to allow the high pressure gas; at least one vacuum pump;
a dispenser assembly to place moldable materials on the substrate;
a door on the chamber housing, or a movable bottom chamber, or a movable top chamber for selectively allowing the substrate and the mold to pass there through; and
means to divide the chamber into two fluidly separate sub-chambers, each sub-chamber being configured for a separate controlled sub-chamber environment including a separate pressure and/or vacuum, a separate gas content, and a separate gas flow rate into and out thereof.

13. The system of claim 12 wherein the mold holding fixture is configured for holding only a periphery of the mold, said mold holding fixture being hollow to expose a central area of the mold for accessing from the side of the substrate surface and the opposing side, the mold holding fixture being attached to inner surface of the chamber and having substantially flat surfaces for uniformly holding the mold with substantially distributed equalized pressure for minimizing deformation of the held mold.

14. The system of claim 12 wherein the movable ring is driven by an air cylinder with pressure adjustable from 0-90 psi, a piezo stage with controlled force, or a solenoid with controlled force.

15. The system of claim 12 wherein the movable ring has a flexible sealing material on its seal surface, the flexible sealing material is made of a flexible plastic material selected from the group consisting of Polytetrafluoroethylene, fluoropolymer elastomer, silicon, and perfluoroelastomer.

16. The system of claim 12 wherein the mold supporting assembly has a hollow center opening that can be configured for mounting on the mold holder, leaving the patterning area of mold surface open or can be configured for mounting on the substrate holder, leaving the substrate surface open, wherein the height of the assembly can be configured for further adjustment by inserting spacers or setting adjustable screws.

17. The system of claim 16 wherein the hollow center of the mold supporting assembly has an opening diameter 0.01 mm-2 mm larger than the diameter of the substrate.

18. The system of claim 12, further comprising a robot having end effectors and controlled by a computer with computer executable instructions, each configured for placement of the substrate in a first position inside the chamber, and placement of the mold in a second position inside the chamber cavity.

19. The system of claim 12 wherein the chamber housing includes one or more windows to the chamber configured for allowing light of one or more wavelengths to pass through the window while maintaining the applied pressure inside the chamber.

20. The system of claim 19 wherein at least one of the chamber windows is coated with multiple layer thin films for reducing light reflections on the window surfaces.

21. The system of claim 12, further comprising at least one gap measurement device for determining a gap distance between the mold surface of the mold and the substrate surface of the substrate while each is in the chamber;
and a gap distance control means for adjusting a position of at least one of the mold and the substrate to obtain a predetermined distance.

22. The system of claim 21 wherein the at least one gap measurement device includes at least one of an optical detection system configured for determining a spatial relationship between the mold and the substrate;
or at least one sensor selected from the group consisting of a laser sensors, and optical sensors, an optical microscopes, and a radiofrequency transceiver sensor.

23. The system of claim 21 wherein the gap measurement device further includes one or more optical microscopes and wherein each of the mold and the substrate include alignment marks, the optical microscopes configured and positioned for observing each of the mold and the substrate alignment marks when the mold and the substrate are positioned within the chamber under an applied pressure.

24. The system of claim 12, further comprising at least one of means to deform the mold transversely toward or away from the substrate while each are within the chamber; and means to deform the substrate towards or away from the mold using multiple motions capable of six degree of freedom while each are within the chamber.

25. The system of claim 12, further comprising one or more UV lamps positioned either outside or inside of the chamber for exposing UV radiation onto the substrate.

26. The system of claim 12 wherein the mold is made of at least one material selected from the group consisting of a quartz, a glass, a silicon, a Ni, a plastic, a metal, and a semiconductor, and wherein the mold has a mold thickness of between about 0.001 mm to about 25 mm.

* * * * *